US012663315B2

(12) United States Patent
Cong et al.

(10) Patent No.: US 12,663,315 B2
(45) Date of Patent: Jun. 23, 2026

(54) CHAMBER KITS, SYSTEMS, AND METHODS FOR CALIBRATING TEMPERATURE SENSORS FOR SEMICONDUCTOR MANUFACTURING

(71) Applicant: Applied Materials, Inc., Santa Clara, CA (US)

(72) Inventors: Zhepeng Cong, San Jose, CA (US); Tao Sheng, Santa Clara, CA (US); Khokan C. Paul, Cupertino, CA (US); Ashur J. Atanos, San Jose, CA (US); Nimrod Smith, Cupertino, CA (US); Vinh N. Tran, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 356 days.

(21) Appl. No.: 18/215,040

(22) Filed: Jun. 27, 2023

(65) Prior Publication Data

US 2025/0003806 A1    Jan. 2, 2025

(51) Int. Cl.
| | |
|---|---|
| *G01J 5/80* | (2022.01) |
| *C30B 25/10* | (2006.01) |
| *C30B 25/12* | (2006.01) |
| *G01J 5/00* | (2022.01) |

(52) U.S. Cl.
CPC .............. *G01J 5/80* (2022.01); *C30B 25/10* (2013.01); *C30B 25/12* (2013.01); *G01J 5/0007* (2013.01)

(58) Field of Classification Search
CPC .......... G01J 5/80; G01J 5/0007; C30B 25/10; C30B 25/12; C30B 25/16; C30B 16/46; C30B 16/53
See application file for complete search history.

(56) References Cited

U.S. PATENT DOCUMENTS

| | | | |
|---|---|---|---|
| 6,179,466 B1 * | 1/2001 | Peuse | G01J 5/0821 |
| | | | 374/2 |
| 6,284,048 B1 | 9/2001 | Van Bilsen et al. | |
| 9,653,340 B2 | 5/2017 | Boguslavskiy et al. | |
| 11,359,972 B2 | 6/2022 | Cong et al. | |
| 2003/0236642 A1 | 12/2003 | Timans | |
| 2004/0144323 A1 | 7/2004 | Kai | |
| 2012/0118225 A1 | 5/2012 | Hsu et al. | |
| 2012/0263875 A1 | 10/2012 | Brenninger et al. | |
| 2014/0261159 A1 | 9/2014 | Okabe et al. | |

(Continued)

OTHER PUBLICATIONS

International Search Report and Written Opinion dated Jul. 2, 2024 for International Application No. PCT/US2024/019971.

*Primary Examiner* — Randy W Gibson
(74) *Attorney, Agent, or Firm* — Patterson + Sheridan, LLP

(57) ABSTRACT

The present disclosure relates to chamber kits, systems, and methods for calibrating temperature sensors for semiconductor manufacturing. In one or more embodiments, a chamber kit for processing chambers applicable for semiconductor manufacturing includes a plate formed of a transparent material. The plate includes an opening formed in an outer face of the plate. The chamber kit includes a first calibration substrate positioned at least partially in the opening of the plate, and the first calibration substrate is formed of a first material. The chamber kit includes a second calibration substrate positioned at least partially in the opening of the plate, and the second calibration substrate is formed of a second material that is different than the first material.

20 Claims, 10 Drawing Sheets

(56) References Cited

U.S. PATENT DOCUMENTS

| 2021/0272858 | A1* | 9/2021 | Storek ........................ G01J 5/06 |
| 2022/0268634 | A1 | 8/2022 | Cong et al. |
| 2022/0325400 | A1 | 10/2022 | Cong et al. |

* cited by examiner

CHAMBER KITS, SYSTEMS, AND METHODS FOR CALIBRATING TEMPERATURE SENSORS FOR SEMICONDUCTOR MANUFACTURING

BACKGROUND

Field

The present disclosure relates to chamber kits, systems, and methods for calibrating temperature sensors for semiconductor manufacturing.

Description of the Related Art

Semiconductor substrates are processed for a wide variety of applications, including the fabrication of integrated devices and microdevices. During processing, various parameters can affect the uniformity of material deposited on the substrate. For example, the temperature of the substrate and/or temperature(s) of processing chamber component(s) can affect deposition uniformity.

Precise control over a heating source allows a substrate to be heated within tolerances. The temperature of the substrate can affect the uniformity of the material deposited on the substrate and/or the deposition rate of the material deposited on the substrate.

The temperature of the substrate can be measured throughout the deposition process using temperature sensors. Over time, the temperature readings of the temperature sensors can drift due to changes of the conditions of the hardware within the process chamber. Aging of the heating lamps, and/or substrate support (among other factors) can affect the temperature measurements over time, hindering accuracy. Coating of window(s) can also affect temperature measurements, hindering accuracy. Moreover, a temperature sensor can receive energy from components other than the component that the temperature sensor aims to monitor.

Calibration methods can involve opening of the process chamber and machine down time. Moreover, it can be difficult and time-consuming to calibrate multiple temperature sensors at different locations.

Therefore, a need exists for improved methods and apparatus for calibrating temperature sensors of systems that include thermal process chambers.

SUMMARY

The present disclosure relates to chamber kits, systems, and methods for calibrating temperature sensors for semiconductor manufacturing.

In one or more embodiments, a chamber kit for processing chambers applicable for semiconductor manufacturing includes a plate formed of a transparent material. The plate includes an opening formed in an outer face of the plate. The chamber kit includes a first calibration substrate positioned at least partially in the opening of the plate, and the first calibration substrate is formed of a first material. The chamber kit includes a second calibration substrate positioned at least partially in the opening of the plate, and the second calibration substrate is formed of a second material that is different than the first material.

In one or more embodiments, a method of calibrating a temperature sensor applicable for semiconductor manufacturing includes heating a substrate support positioned in a process chamber. The method includes irradiating, using an energy source, one or more of a first calibration substrate or a second calibration substrate positioned at least partially in an opening formed in a plate positioned in the process chamber. The method includes determining one or more actual temperatures using energy reflected off of one of the first calibration substrate or the second calibration substrate. The method includes determining one or more measured temperatures using energy reflected off of the other of the first calibration substrate or the second calibration substrate and received by the temperature sensor. The method includes calibrating the temperature sensor by comparing the one or more measured temperatures and the one or more actual temperatures.

In one or more embodiments, a system for processing substrates and applicable for semiconductor manufacturing includes a chamber body that includes one or more sidewalls, and a window. The one or more sidewalls and the window at least partially define an internal volume. The system includes one or more heat sources configured to heat the internal volume, a substrate support disposed in the internal volume, and a plate disposed in the internal volume between the substrate support and the window. The plate includes an opening formed in an outer face of the plate. The system includes a temperature sensor configured to sense temperatures of the plate. The system includes a first calibration substrate positioned at least partially in the opening of the plate, a second calibration substrate positioned at least partially in the opening of the plate, and a controller. The controller includes instructions that, when executed, cause a plurality of operations to be conducted. The plurality of operations include heating the substrate support, and irradiating, using an energy source, one or more of the first calibration substrate or the second calibration substrate. The plurality of operations include determining one or more actual temperatures using energy reflected off of one of the first calibration substrate or the second calibration substrate. The plurality of operations include determining one or more measured temperatures using energy reflected off of the other of the first calibration substrate or the second calibration substrate and received by the temperature sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to chamber kits, systems, and methods for calibrating temperature sensors for semiconductor manufacturing.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
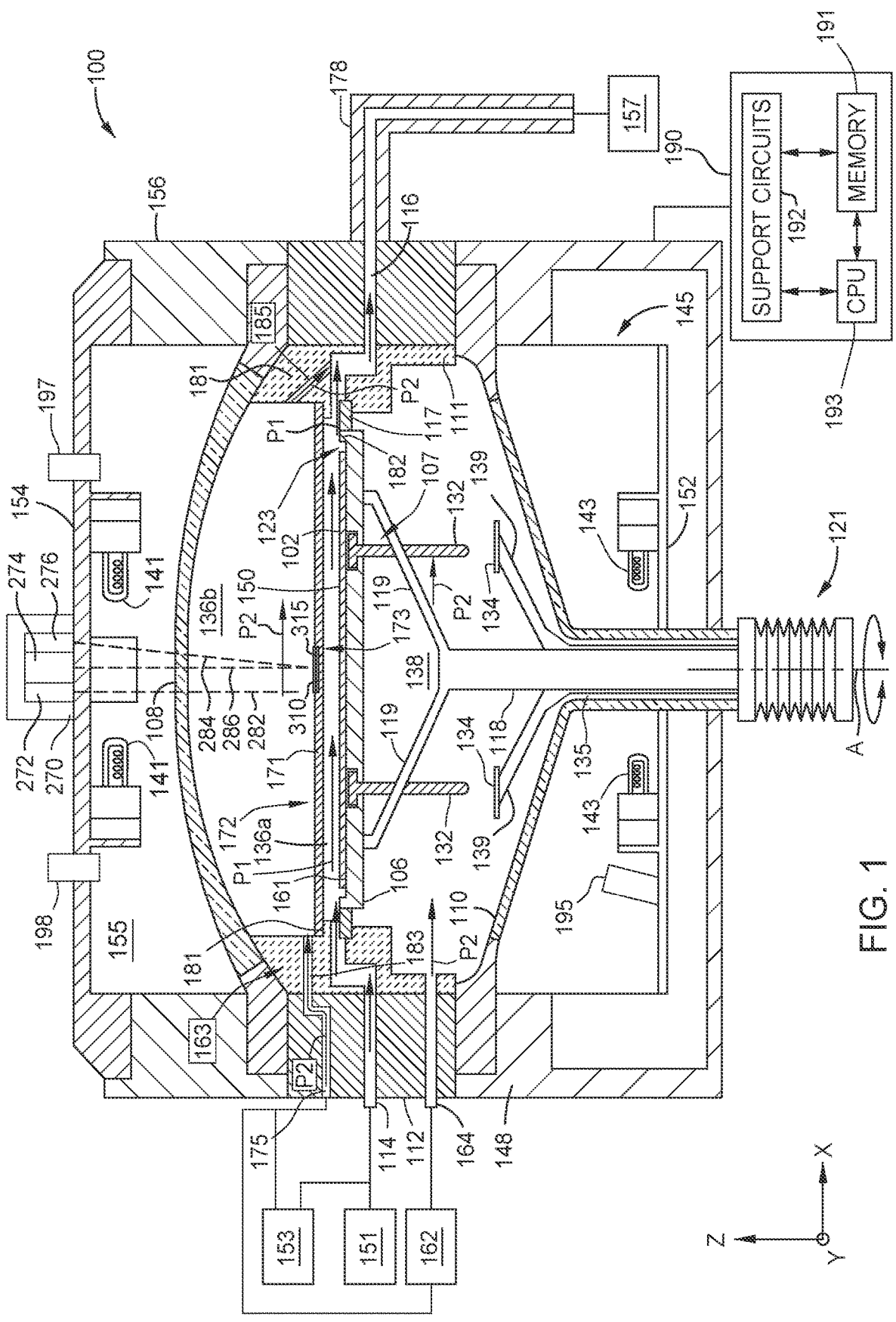
FIG. 1 is a schematic side cross-sectional view of a processing chamber, according to one or more embodiments.

FIG. 1 is a schematic side cross-sectional view of a processing chamber 100, according to one or more embodiments. The processing chamber 100 is a deposition chamber. In one or more embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102. The processing chamber 100 is shown in a processing condition in FIG. 1.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper heat sources

141, and a plurality of lower heat sources 143. In one or more embodiments, the upper heat sources 141 include upper lamps and the lower heat sources 143 include lower lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein.

The substrate support 106 is disposed between the upper window 108 and the lower window 110. The substrate support 106 supports the substrate 102. In one or more embodiments, the substrate support 106 includes a susceptor. Other substrate supports (including, for example, a substrate carrier and/or one or more ring segment(s) that support one or more outer regions of the substrate 102) are contemplated by the present disclosure. The plurality of upper heat sources 141 are disposed between the upper window and a lid 154. The plurality of upper heat sources 141 form a portion of the upper heat source module 155.

The plurality of lower heat sources 143 are disposed between the lower window 110 and a floor 152. The plurality of lower heat sources 143 form a portion of a lower heat source module 145. The upper window 108 is an upper dome and/or is formed of an energy transmissive material, such as quartz. The lower window 110 is a lower dome and/or is formed of an energy transmissive material, such as quartz.

An upper volume 136 and a purge volume 138 are formed between the upper window 108 and the lower window 110. The upper volume 136 and the purge volume 138 are part of an internal volume defined at least partially by the upper window 108, the lower window 110, and one or more liners 111, 163.

The internal volume has the substrate support 106 disposed therein. The substrate support 106 includes a top surface on which the substrate 102 is disposed. The substrate support 106 is attached to a shaft 118. In one or more embodiments, the substrate support 106 is connected to the shaft 118 through one or more arms 119 connected to the shaft 118. The shaft 118 is connected to a motion assembly 121. The motion assembly 121 includes one or more actuators and/or adjustment devices that provide movement and/or adjustment for the shaft 118 and/or the substrate support 106 within the upper volume 136.

The substrate support 106 may include lift pin holes 107 disposed therein. The lift pin holes 107 are each sized to accommodate a lift pin 132 for lifting of the substrate 102 from the substrate support 106 before or after a deposition process is performed. The lift pins 132 may rest on lift pin stops 134 when the substrate support 106 is lowered from a process position to a transfer position. The lift pin stops 134 can include a plurality of arms 139 that attach to a shaft 135.

The flow module 112 includes one or more gas inlets 114 (e.g., a plurality of gas inlets), one or more purge gas inlets 164 (e.g., a plurality of purge gas inlets), and one or more gas exhaust outlets 116. The one or more gas inlets 114 and the one or more purge gas inlets 164 are disposed on the opposite side of the flow module 112 from the one or more gas exhaust outlets 116. A pre-heat ring 117 is disposed below the one or more gas inlets 114 and the one or more gas exhaust outlets 116. The pre-heat ring 117 is disposed above the one or more purge gas inlets 164. The one or more liners 111, 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a respective one or more process gases P1 and one or more purge gases P2 parallel to the top surface 150 of a substrate 102 disposed within the upper volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. The one or more process gases P1 supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). The one or more purge gases P2 supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (Cl). In one or more embodiments, the one or more process gases P1 include silicon phosphide (SiP) and/or phosphine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

A includes a plate 171 having a first face 172 and a second face 173 opposing the first face 172. In one or more embodiments, the plate 171 is part of a flow guide structure. The second face 173 faces the substrate support 106. The processing chamber 100 includes the one or more liners 111, 163. An upper liner 163 includes an annular section 181 and one or more ledges 182 extending inwardly relative to the annular section 181. The one or more ledges 182 are configured to support one or more outer regions of the second face 173 of the plate 171. The upper liner 163 includes one or more inlet openings 183 and one or more outlet openings 185. In one or more embodiments, the plate 171 is in the shape of a disc, and the annular section 181 is in the shape of a ring. The plate 171 can be in the shape of a rectangle. The plate 171 divides the upper volume 136 between the substrate support 106 and the upper window 108 into a lower portion 136a and an upper portion 136b. The lower portion 136a is a processing portion. In one or more embodiments, the plate 171 is an isolation plate that fluidly isolates the upper portion 136b from the lower portion 136a.

The flow module 112 (which can be at least part of a sidewall of the processing chamber 100) includes the one or more gas inlets 114 in fluid communication with the lower portion 136a. The flow module 112 includes one or more second gas inlets 175 in fluid communication with the upper portion 136b. The one or more gas inlets 114 are in fluid communication with one or more flow gaps between the upper liner 163 and a lower liner 111. The one or more second gas inlets 175 are in fluid communication with the one or more inlet openings 183 of the upper liner 163.

During a deposition operation (e.g., an epitaxial growth operation), the one or more process gases P1 flow through the one or more gas inlets 114, through the one or more gaps, and into the lower portion 136a to flow over the substrate 102. During the deposition operation, one or more purge gases P2 flow through the one or more second gas inlets 175, through the one or more inlet openings 183 of the lower liner 111, and into the upper portion 136b. The one or more purge gases P2 flow simultaneously with the flowing of the one or more process gases P1. The flowing of the one or more purge gases P2 through the upper portion 136b facilitates reducing or preventing flow of the one or more process gases P1 into the upper portion 136b that would contaminate the upper portion 136b. The one or more process gases P1 are exhausted through gaps between the upper liner 163 and the lower liner 111, and through the one or more gas exhaust outlets 116. The one or more purge gases P2 are exhausted through the one or more outlet openings 185, through the same gaps between the upper liner 163 and the lower liner 111, and through the same one or more gas exhaust outlets 116 as the one or more process gases P1. The present disclosure contemplates that that one or more purge gases P2 can be separately exhausted through one or more second gas exhaust outlets that are separate from the one or more gas exhaust outlets 116.

The present disclosure also contemplates that the one or more purge gases P2 can be supplied to the purge volume 138 (through the one or more purge gas inlets 164) during the deposition operation, and exhausted from the purge volume 138.

During a cleaning operation, one or more cleaning gases flow through the one or more gas inlets 114, through the one or more gaps (between the upper liner 163 and the lower liner 111), and into the lower portion 136a. During the cleaning operation, one or more cleaning gases also simultaneously flow through the one or more second gas inlets 175, through the one or more inlet openings 183 of the upper liner 163, and into the upper portion 136b. The present disclosure contemplates that the one or more cleaning gases used to clean surfaces adjacent the upper portion 136b can be the same as or different than the one or more cleaning gases used to clean surfaces adjacent the lower portion 136a.

The processing chamber 100 facilitates separating the gases provided to the lower portion 136a from the gases provided to the upper portion 136b, which facilitates parameter adjustability. Additionally, one or more purge gases and one or more cleaning gases can be separately provided to the upper portion 136b to facilitate reduced contamination of the upper window 108 and/or the plate 171.

The processing system includes a measurement assembly 270, according to one or more embodiments. A controller 190 (described below) can control the measurement assembly 270, and conduct calibration of one or more temperature sensors 195, 197, 198, 272. In one or more embodiments, the one or more temperature sensors 195, 197, 198, 272 each include a pyrometer that includes a silicon sensor. The measurement assembly 270 facilitates accurate measurement of the temperature of the substrate 102 and/or the temperature of the plate 171. The measurement assembly 270 includes an energy source 274 (e.g., a light source) and a band edge detector 276. An upper temperature sensor 272, the energy source 274, and the band edge detector 276 are disposed above the substrate 102. A lower temperature sensor 195 is disposed below the substrate 102 and adjacent the floor 152. The energy source 274 and the band edge detector 276 are part of a band edge calibration assembly of the measurement assembly 270.

The energy source 274 is positioned to emit a first energy, and the band edge detector 276 is disposed adjacent to the energy source 274 and positioned to receive the first energy.

The energy source 274 is a laser light source with a controlled intensity and wavelength range. In one or more embodiments, a broad band light source is utilized. The energy source 274 may be a diode laser or an optical cable.

When the energy source 274 is an optical cable, the optical cable is connected to an independent energy source (e.g., light source), which may be disposed near the process chamber 100. The energy source 274 may be a bundle of lasers or optical cables, such that a plurality of beams (e.g., light beams) are focused into a first calibration beam 286 (e.g., calibration light beam). In one or more embodiments, the energy source 274 can emit radiation at a varying wavelength range. The varying wavelength range allows the energy source 274 to emit wavelengths which would be within about 200 nm of the expected absorption edge wavelength of at least one of one or more calibration substrates 310, 315 (described below). The use of a varying wavelength range eliminates noise which may be caused by the use of a wider wavelength spectrum and allows for an increase in the strength of emission of the narrower range from the energy source 274 to increase the signal strength received by the band edge detector 276. In one or more embodiments, one or more of the heat sources 141, 143 are utilized as the energy source 274. In one or more embodiments, the energy source 274 may be a radiation source, such as a thermal radiation source or a broad band radiation source. The radiation source may be a laser diode or an optical assembly. The optical assembly may include a laser, a lamp, and/or a bulb, and/or a plurality of lenses, mirrors, or a combination of lenses and mirrors.

The band edge detector 276 measures the intensity of different wavelengths of energy (e.g., light) within a second calibration beam 284 (e.g., light beam), which is reflected off at least one of one or more calibration substrates 310, 315. The band edge detector 276 is configured to find a band edge wavelength at which the respective calibration substrate 310, 315 transitions from absorbing a wavelength of radiation to reflecting nearly all of a wavelength of radiation. The band edge detector 276 may include several optical components disposed therein in order to separate and measure the second calibration beam 284. In one or more embodiments, the band edge detector 276 is a scanning band edge detector and scans through a range of wavelengths to determine the transition wavelength at which the calibration substrate 310, 315 transitions from absorbing to reflecting radiation. In one or more embodiments, the band edge detector 276 measures the intensity of wavelengths of energy (e.g., light) transmitted through a calibration substrate 310, 315 from below the calibration substrate (such as from the lower heat sources 143, through the plate 171, and through the first calibration substrate 310 described below). The intensity of wavelengths of the radiation transmitted through the first calibration substrate 310 may be measured by the band edge detector 276. The band edge detector 276 then determines a transition wavelength at which the first calibration substrate 310 transitions from absorbing wavelengths to transmitting wavelengths. An optional filter may be placed between the band edge detector 276 and the one or more calibration substrates 310, 315 and configured to filter out radiation emitted by the one or more of the heat sources 141, 143. In one or more embodiments, the filter is omitted and/or the upper heat sources 141 are turned off while powering the lower heat sources 143 during sensor calibration.

One or more additional sensors 197, 198 (e.g., additional upper sensors) can be disposed in or on the lid 154 and configured to measures temperature(s) within the processing chamber 100. Each sensor 195, 197, 198, 272 can be a single-wavelength sensor device or a multi-wavelength (such as dual-wavelength) sensor device. In one or more embodiments, the system including process chamber 100 includes any one, any two, or any three of the four illustrated sensors 195, 197, 198, 272. In one or more embodiments, the process chamber 100 includes one or more additional sensor, in addition to the sensors 195, 197, 198, 272. In one or more embodiments, the process chamber 100 may include sensors disposed at different locations and/or with different orientations than the illustrated sensors 195, 197, 198, 272.

As discussed above, each sensor 195, 197, 198, 272 can be a pyrometer. In one or more embodiments, each sensor 195, 196, 197, 198 is an optical sensor, such as an optical pyrometer. The present disclosure contemplates that sensors other than pyrometers may be used, and/or one or more of the sensors 195, 197, 198, 272 can measure properties other than temperature.

As shown, a controller 190 is in communication with the processing chamber 100 and is used to control processes and methods, such as the operations of the methods described herein.

The controller 190 is configured to receive data or input as sensor readings from a plurality of sensors. The sensors can include, for example: sensors that monitor growth of layer(s) on the substrate 102; and/or sensors that monitor temperatures of the substrate 102, the substrate support 106, the plate 171, and/or the liners 111, 163. The controller 190 is equipped with or in communication with a system model of the processing chamber 100. The system model includes a heating model, a film uniformity model, a film deposition rate model, a coating model, a rotational position model, and/or a gas flow model. The system model is a program configured to estimate parameters (such as a plate temperature of the plate 171 gas flow rate, a gas pressure, a processing temperature of the substrate support 106 and/or the substrate 102, a rotational position of component(s), a heating profile, a coating condition, and/or a cleaning condition) within the processing chamber 100 throughout a deposition operation and/or a cleaning operation. The controller 190 is further configured to store readings and calculations. The readings and calculations include previous sensor readings, such as any previous sensor readings within the processing chamber 100. The readings and calculations further include the stored calculated values from after the sensor readings are measured by the controller 190 and run through the system model. Therefore, the controller 190 is configured to both retrieve stored readings and calculations as well as save readings and calculations for future use. Maintaining previous readings and calculations enables the controller 190 to adjust the system model over time to reflect a more accurate version of the processing chamber 100.

The controller 190 can monitor, estimate an optimized parameter, calibrate one or more temperature sensors, generate an alert on a display, halt a deposition operation, initiate a chamber downtime period, delay a subsequent iteration of the deposition operation, initiate a cleaning operation, detect a cleaning condition for the plate 171, halt the cleaning operation, adjust a heating power, and/or otherwise adjust the process recipe.

The controller 190 includes a central processing unit (CPU) 193 (e.g., a processor), a memory 191 containing instructions, and support circuits 192 for the CPU 193. The controller 190 controls various items directly, or via other computers and/or controllers. In one or more embodiments, the controller 190 is communicatively coupled to dedicated controllers, and the controller 190 functions as a central controller.

Figure 3:
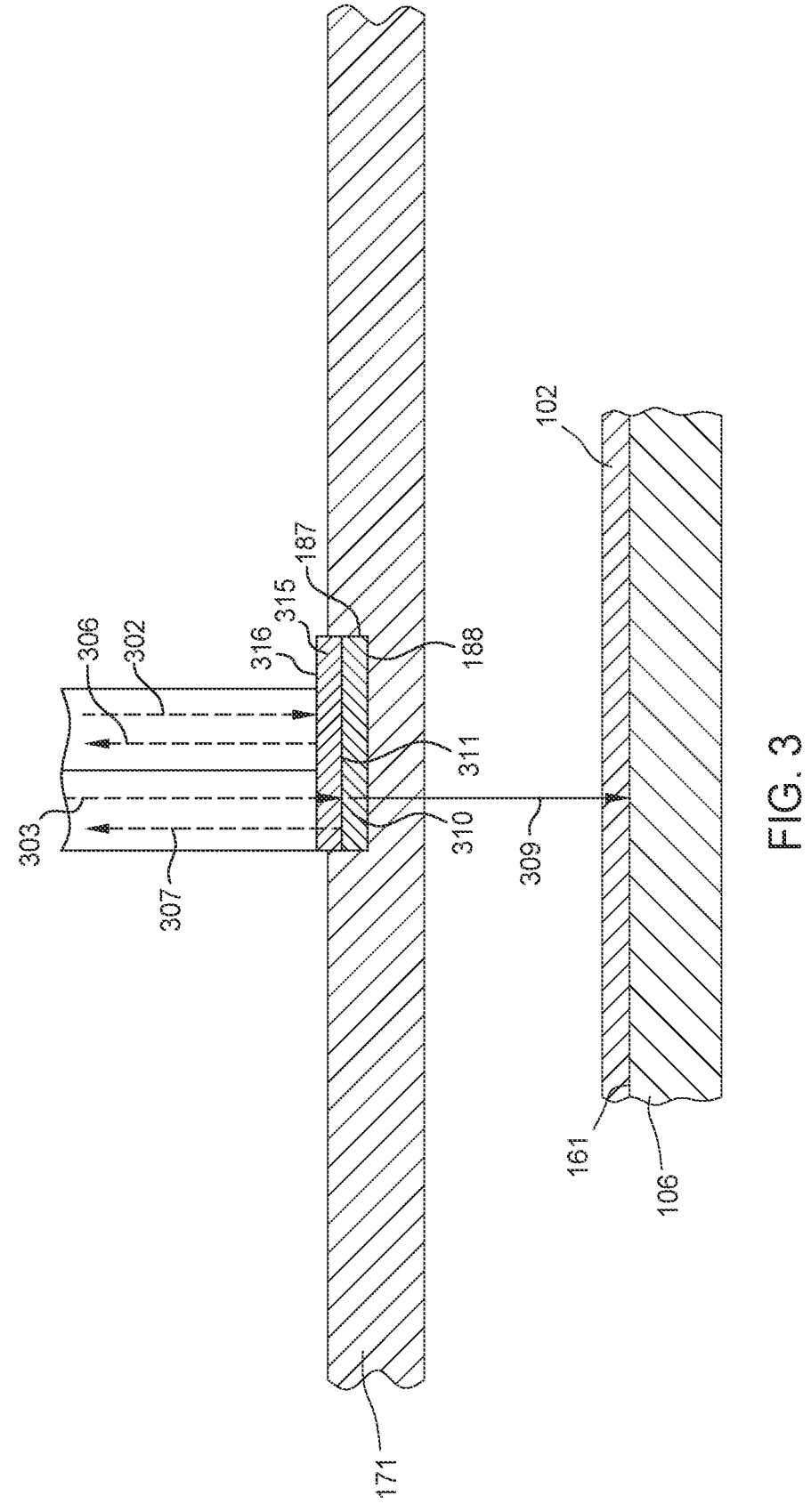
FIG. 3 illustrates a simplified schematic partial cross-sectional view of a portion of the processing chamber shown in FIG. 1, according to one or more embodiments.
Figure 4:
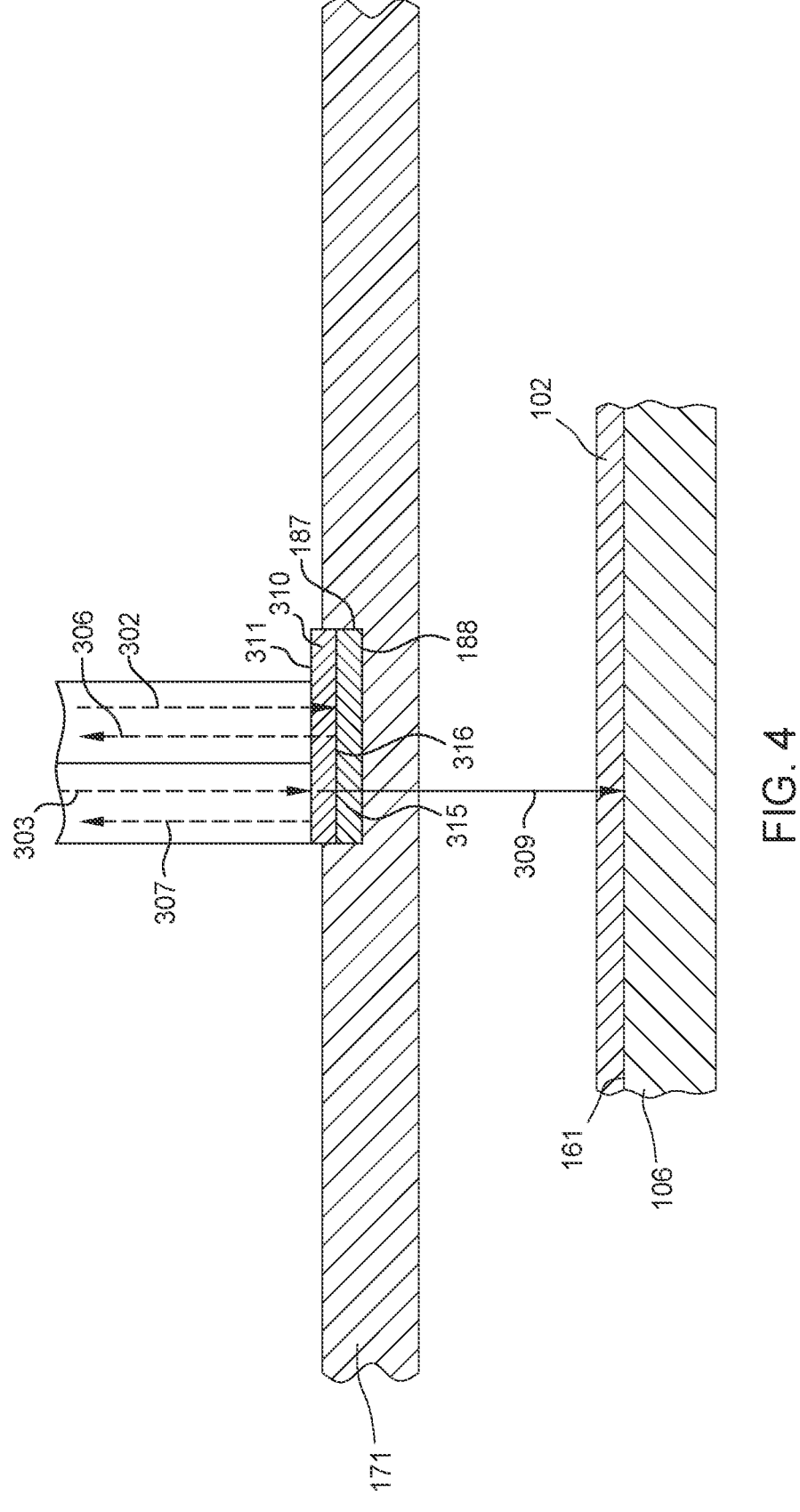
FIG. 4 illustrates a simplified schematic partial cross-sectional view of a portion of the processing chamber shown in FIG. 1, according to one or more embodiments.

The controller 190 is of any form of a general-purpose computer processor that is used in an industrial setting for controlling various substrate processing chambers and equipment, and sub-processors thereon or therein. The memory 191, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 192 of the controller 190 are coupled to the CPU 193 for supporting the CPU 193. The support circuits 192 include cache, power supplies, clock circuits, input/output circuitry and subsystems, and the like. Operational parameters (e.g., one or more actual temperatures, one or more measured temperatures for the plate 171, one or more correction ratios, and/or one or more reference lines of actual temperatures correlated to measured temperatures) and operations are stored in the memory 191 as a software routine that is executed or invoked to turn the controller 190 into a specific purpose controller to control the operations of the various chambers/modules described herein. The controller 190 is configured to conduct any of the operations described herein. The instructions stored on the memory, when executed, cause one or more of operations of: FIG. 1, FIG. 3, FIG. 4, method 900, FIG. 10, and/or FIG. 11 to be conducted in relation to the processing chamber 100. The controller 190 and the processing chamber 100 are at least part of a system for processing substrates.

The various operations described herein (such as the operations of FIG. 1, FIG. 3, FIG. 4, method 900, FIG. 10, and/or FIG. 11) can be conducted automatically using the controller 190, or can be conducted automatically or manually with certain operations conducted by a user.

In one or more embodiments, the controller 190 includes a mass storage device, an input control unit, and a display unit. The controller 190 monitors the temperature of the substrate 102, the temperature of the substrate support 106, the temperature of the plate 171, the process gas flow, and/or the purge gas flow. The controller 190 can also initiate calibration of one or more temperature sensors. In one or more embodiments, the controller 190 includes multiple controllers 190, such that the stored readings and calculations and the system model are stored within a separate controller from the controller 190 which controls the operations of the processing chamber 100. In one or more embodiments, all of the system model and the stored readings and calculations are saved within the controller 190.

The controller 190 is configured to control (such as by calibrating) one or more of the sensors 195, 197, 198, 272, the deposition, the cleaning, the rotational position, the heating, and gas flow through the processing chamber 100 by providing an output to the controls for the sensors 195, 196, 197, 198, the upper heat sources 141, the lower heat sources 143, the process gas source 151, the purge gas source 162, the motion assembly 121, and the exhaust pump 157.

The controller 190 is configured to adjust the output to the controls based on the sensor readings, the system model, and the stored readings and calculations. The controller 190 includes embedded software and a compensation algorithm to calibrate measurements. The controller 190 can include one or more machine learning algorithms and/or artificial intelligence algorithms that estimate optimized parameters for the calibration operations, the deposition operations, and/or the cleaning operations (such as for adjusting a calibration of measured temperature readings returned by a temperature sensor and/or adjusting a heating power). The optimized parameter(s) can include, for example, one or more actual temperatures, one or more measured temperatures, one or more correction ratios, and/or one or more reference lines of actual temperatures correlated to measured temperatures.

The one or more machine learning algorithms and/or artificial intelligence algorithms may implement, adjust and/or refine one or more algorithms, inputs, outputs or variables described above. Additionally or alternatively, the one or more machine learning algorithms and/or artificial intelligence algorithms may rank or prioritize certain aspects of adjustments of the process chamber 100, the method 900 relative to other aspects of the process chamber 100 and/or the method 900. The one or more machine learning algorithms and/or artificial intelligence algorithms may account for other changes within the processing systems such as hardware replacement and/or degradation. In one or more embodiments, the one or more machine learning algorithms and/or artificial intelligence algorithms account for upstream or downstream changes that may occur in the processing system due to variable changes of the process chamber 100 and/or the method 900. For example, if variable "A" is adjusted to cause a change in aspect "B" of the process, and such an adjustment unintentionally causes a change in aspect "C" of the process, then the one or more machine learning algorithms and/or artificial intelligence algorithms may take such a change of aspect "C" into account. In such an embodiment, the one or more machine learning algorithms and/or artificial intelligence algorithms embody predictive aspects related to implementing the process chamber 100 and/or the method 900. The predictive aspects can be utilized to preemptively mitigate unintended changes within a processing system.

The one or more machine learning algorithms and/or artificial intelligence algorithms can use, for example, a regression model (such as a linear regression model) or a clustering technique to estimate optimized parameters. The algorithm can be unsupervised or supervised. The one or more machine learning algorithms and/or artificial intelligence algorithms can optimize, for example, one or more actual temperatures, one or more measured temperatures, one or more correction ratios, one or more reference lines of actual temperatures correlated to measured temperatures, a heating power applied to the heat sources 141, 143, a cleaning recipe, and/or a processing recipe.

In one or more embodiments, the controller 190 automatically conducts the operations described herein without the use of one or more machine learning algorithms and/or artificial intelligence algorithms. In one or more embodiments, the controller 190 compares measurements (such as measured temperatures and/or actual temperatures) to data in a look-up table and/or a library to calibrate a temperature sensor. The controller 190 can stored measurements as data in the look-up table and/or the library.

Figure 2:
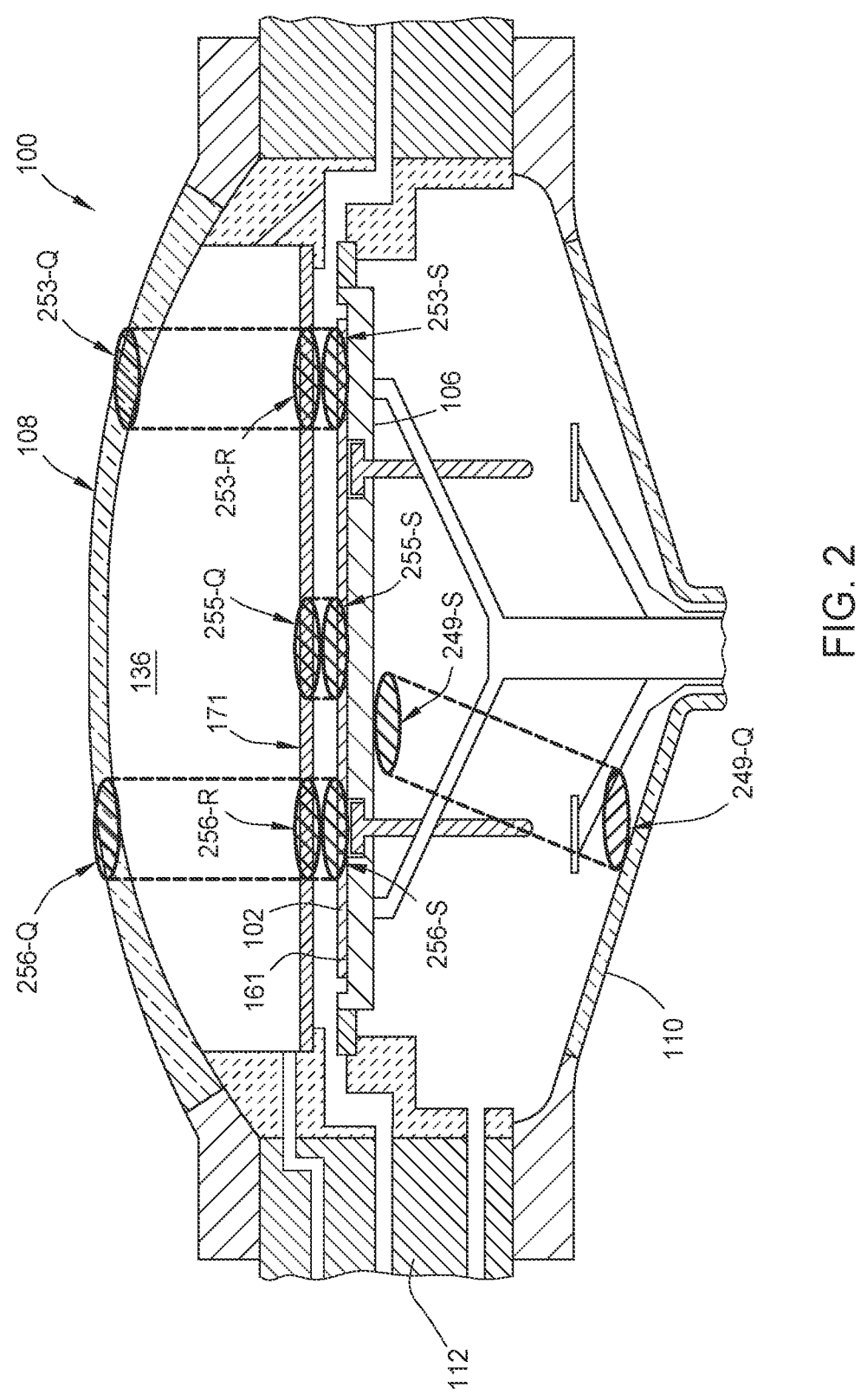
FIG. 2 is a schematic enlarged view of the processing chamber shown in FIG. 1, according to one or more embodiments.

FIG. 2 is a schematic enlarged view of the processing chamber 100 shown in FIG. 1, according to one or more embodiments. The substrate support 106 has an upper surface 161 (e.g., a support surface) and a lower surface 169.

FIG. 2 also illustrates a plurality of temperature measurement sites 249-Q, 249-S, 253-Q, 253-R, 253-S, 255-Q, 255-S, 256-Q, 256-R, 256-S. For example, in one or more embodiments, the lower sensor 195 (shown in FIG. 1) is configured to measure temperatures at site 249-Q (e.g., at a middle peripheral region of the lower window 110) and/or site 249-S (e.g., at a middle peripheral region of the lower surface 169 of the substrate support 106). In one or more embodiments, a first upper sensor 272 (shown in FIG. 1) is configured to measure temperatures at site 255-Q (e.g., at a central region of the plate 171, which can include the one or more calibration substrates 310, 315) and/or site 255-S (e.g., at a central region of the substrate 102 and/or a central region of the upper surface 161 of the substrate support 106). In one or more embodiments, a second upper sensor 197 (shown in FIG. 1) is configured to measure temperatures at site 253-Q (e.g., at an outer peripheral region of the upper window 108), at site 253-R (e.g., at an outer peripheral region of the plate 171, which can include the one or more calibration substrates 310, 315), and/or site 253-S (e.g., at an outer peripheral region of the substrate 102 and/or an outer peripheral region of the upper surface 161 of the substrate support 106). In one or more embodiments, a third upper sensor 198 (shown in FIG. 1) is configured to measure temperatures at site 256-Q (e.g., at an outer peripheral region of the upper window 108), at site 256-R (e.g., at an outer peripheral region of the plate 171, which can include the one or more calibration substrates 310, 315), and/or site 256-S (e.g., at an outer peripheral region of the substrate 102 and/or an outer peripheral region of the upper surface 161 of the substrate support 106).

The sensors 195, 197, 198, 272 may be positioned and/or oriented differently than what is shown in FIG. 1 and FIG. 2, while still capable of measuring temperatures at a site on the plate 171 (which can include the one or more calibration substrates 310, 315), a site on one or more of the windows (e.g., upper window 108 and/or lower window 110), and/or a site on one of the surfaces of substrates support 106 (e.g., upper surface 161 and/or lower surface 169) and/or the substrate 102. Each of the sensors 195, 197, 198, 272 may be adapted to detect energy (e.g., radiation, such as light) at two or more (such as three or more) different wavelength ranges. For example, in one or more embodiments the two or three wavelength ranges of the upper sensors 197, 198, 272 are selected to be (1) a wavelength range at which the plate 171 is absorptive (e.g., about 2.48 microns to about 2.98 microns), (2) a wavelength range at which the substrate support 106 and/or the substrate 102 is absorptive (e.g., about 3.17 microns to about 3.67 microns), and (3) a wavelength range at which the upper window 108 and/or the lower window 110 is absorptive (e.g., about 4.75 microns to about 5.25 microns, such as about 5.0 microns). As another example, in one or more embodiments the two wavelength ranges of the lower sensor 195 are selected to be (1) a wavelength range at which the upper window 108 and/or the lower window 110 is absorptive (e.g., about 4.75 microns to about 5.25 microns, such as about 5.0 microns), and (2) a wavelength range at which the substrate support 106 and/or the substrate 102 is absorptive (e.g., about 3.17 microns to about 3.67 microns).

FIG. 3 illustrates a simplified schematic partial cross-sectional view of a portion of the processing chamber 100 shown in FIG. 1, according to one or more embodiments. As illustrated, temperature measurement at each of the sites 249-Q, 249-S, 253-Q, 253-R, 253-S, 255-Q, 255-S, 256-Q, 256-R, and 256-S may be conducted using one or more radiation beams. In one or more embodiments, each of the sensors 195, 197, 198, 272 is configured to emit one or more radiation beams and receive one or more reflected radiation beams.

A chamber kit includes the plate 171, the plate 171 is formed of a transparent material, and the plate 171 includes an opening 187 formed in an outer face of the plate 171. The chamber kit includes one or more calibration substrates 310, 315. The one or more calibration substrates 310, 315 are sized and shaped to be positioned at least partially in the opening 187. In one or more embodiments, the one or more calibration substrates 310, 315 have a diameter equal to or less than a diameter of the opening 187, and the one or more calibration substrates 310, 315 have a circular shape (such as a disc shape).

The one or more calibration substrates 310, 315 include a first calibration substrate 310 positioned at least partially in the opening 187 of the plate 171, and a second calibration substrate 315 positioned at least partially in the opening 187 of the plate 171. In one or more embodiments, the plate 171 includes a thickness T1 that is 5.0 mm or less, such as within a range of 2.8 mm to 3.2 mm, for example about 3.0 mm.

The first calibration substrate is formed of a first material, and the second calibration substrate is formed of a second material that is different than the first material. In one or more embodiments, the first material includes one or more of: doped silicon (such as P+++ silicon or P− silicon), InP, GeN, and/or silicon carbide (SiC). The SiC can have an atomic structure that is 3C, 4H, or 6H. In one or more embodiments, the first material is SiC having an atomic structure that is 4H. In one or more embodiments, the second material includes a quartz material, such as a transparent quartz. In one or more embodiments, the quartz material of the second material has a hydroxyl concentration that is more than 750 ppm. Other hydroxyl concentrations are contemplated for the second material.

During calibration, and as shown in FIG. 3, a first radiation beam 302 may be emitted by a first upper sensor (such as sensor 272) and a second radiation beam 303 may be emitted by a second upper sensor (such as sensor 198).

At the first face 316 of the second calibration substrate 315, a portion of the first radiation beam 302 may be reflected as radiation beam 306. In one or more embodiments, the radiation beam 306 has a first wavelength within a range of about 2.48 microns to about 2.98 microns.

As shown in FIG. 3, the second radiation beam 303 transmits through the second calibration substrate 315. At the first face 311 of the first calibration substrate 310, a portion of the second radiation beam 303 may be reflected as radiation beam 307. In one or more embodiments, the radiation beam 307 has a second wavelength within a range of about 3.17 microns to about 3.67 microns. Another portion of radiation beam 303 may be transmitted as radiation beam 309. It should be appreciated that the reflected portion (beam 307) and the transmitted portion (beam 309) may be of differing wavelengths, depending on the material and the temperature of the first calibration substrate 310. The first upper sensor (such as sensor 272) is configured to receive the reflected radiation beam 306 and measure the intensity of the radiation beam 306. For example, the first upper sensor (such as sensor 272) may be configured to receive and measure, at least, radiation in the first wavelength range of about 2.48 microns to about 2.98 microns.

The second upper sensor (such as sensor 198) is configured to receive the reflected radiation beam 307 and measure the intensity of the radiation beam 307. For example, the second upper sensor (such as sensor 198) may be configured to receive and measure, at least, radiation in the wavelength range of about 3.17 microns to about 3.67 microns.

In one or more embodiments, one or more of the sensors 195, 197, 198, 272 may measure more than two (such as three or more) different wavelengths (or wavelength ranges) simultaneously. For example, one or more of the sensors 195, 197, 198, 272 may contemporaneously measure radiation in the about 3.17 micron to about 3.67 micron range, the about 2.48 micron to about 2.98 micron range, and/or the about 4.75 micron to about 5.25 micron range.

As discussed above, the temperature measurements made by each of the sensors 195, 197, 198, 272 are used to monitor temperatures within the process chamber 100. Moreover, the temperature measurements may be utilized to assess operational states (such as film thickness uniformities, film deposition rates, coating conditions and/or cleaning conditions) of the process chamber 100 and/or to calibrate temperature sensors.

In the implementation shown in FIG. 3, the second calibration substrate 315 is stacked on the first calibration substrate 310.

The first calibration substrate 310 is supported by a recessed surface 188 of the plate 171, and the second calibration substrate 315 is supported by the first calibration substrate 310. In such an implementation, a band edge calibration assembly (e.g., including the energy source 274 and the band edge detector 276) is used to calibrate a temperature sensor (such as upper sensor 272) that is used to measure a temperature of the plate 171 after calibration.

During calibration, the energy source 274 emits first energy (e.g., first calibration beam 286) toward the first calibration substrate 310, and a band edge absorption wavelength is determined from the first energy reflected off of the first calibration substrate 310 (e.g., as second calibration beam 284) and received by the band edge detector 276). An actual temperature (e.g., a corrected temperature) is determined using the determined band edge absorption wavelength. A measured temperature is measured based on received second energy (e.g., reflected radiation beam 306) of the temperature sensor (such as upper sensor 272). The temperature sensor (such as upper sensor 272) is then calibrated by comparing the measured temperature and the actual temperature.

FIG. 4 illustrates a simplified schematic partial cross-sectional view of a portion of the processing chamber 100 shown in FIG. 1, according to one or more embodiments. The implementation shown in FIG. 4 is similar to the implementation shown in FIG. 3, and includes one or more of the aspects, features, components, operations and/or properties thereof.

In the implementation shown in FIG. 4, the second calibration substrate 315 is supported by the recessed surface 188 of the plate 171, and the first calibration substrate 310 is supported by the second calibration substrate 315. In such an implementation, a first temperature sensor (such as upper sensor 272) is calibrated using a second temperature sensor (such as upper sensor 198). After calibration, the first temperature sensor (such as upper sensor 272) can be used to measure a temperature of the plate 171 and the second temperature sensor (such as upper sensor 198) can be used to measure a temperature of the substrate support 106 and/or the substrate 102.

During calibration, a first energy and a second energy are emitted toward the first calibration substrate 310. The first energy can be emitted by the first temperature sensor (such as upper sensor 272), and the second energy can be emitted by the second temperature sensor (such as upper sensor 198). As shown in FIG. 4, the first radiation beam 302 transmits through the first calibration substrate 310. One or more of the first energy and/or the second energy can be emitted by the lower heat sources 143. An actual temperature (e.g., a corrected temperature) is determined using the second energy reflected off of the first calibration substrate 310 and received by the second temperature sensor (such as upper sensor 198). A measured temperature is determined based on the received first energy of the first temperature sensor (such as upper sensor 272). The first temperature sensor (such as upper sensor 272) is then calibrated by comparing the measured temperature and the actual temperature.

In one or more embodiments, the controller 190 may receive temperature measurements from any of the sensors 195, 197, 198, 272. The controller 190 may store one or more of the actual temperatures and/or one or more of the measured temperatures, and can compare the stored values to one or more subsequent iterations of the actual temperatures and/or the measured temperatures. The controller 190 may compare any one of the temperature measurements with any one or more of the other temperature measurements. The controller 190 may assess an operational state of the process chamber 100 based on the temperature measurements and/or on the comparisons thereof.

The controller 190 may cause a change in the environment of the process chamber based on assessment of the temperature measurements. For example, the controller may adjust input power to heat sources 141, 143 in order to adjust the heating of the substrate support 106 and/or the substrate 102. The controller 190 may issue an alert based on the assessment, and generate the alert on a display for a user to see. For example, the controller 190 may notify a user that one of the sensors 195, 197, 198, 272 needs calibration and/or replacement.

Figure 5A:
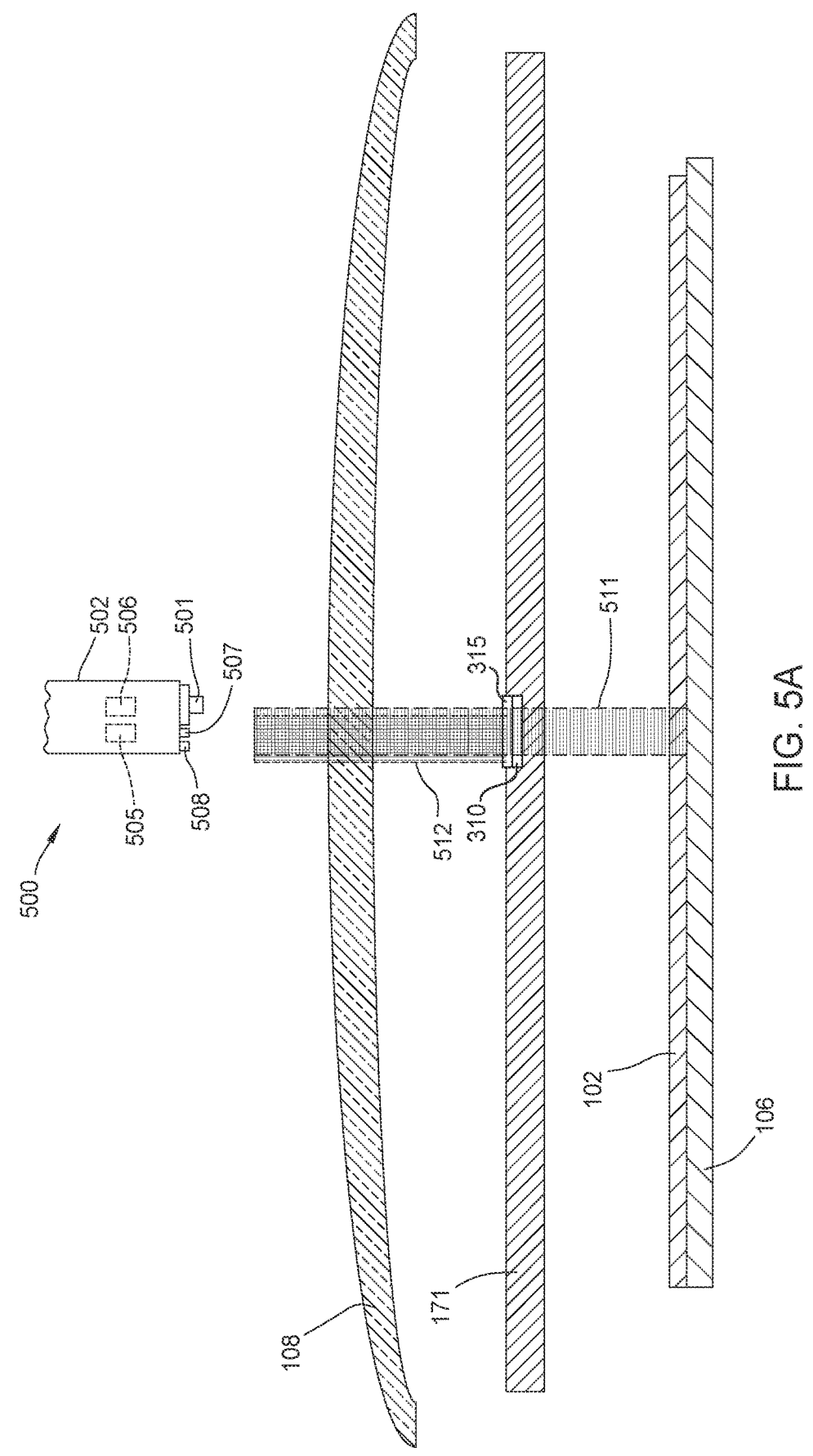
FIG. 5A is a schematic partial view of the system including the processing chamber shown in FIG. 1, according to one or more embodiments.

FIG. 5A is a schematic partial view of the system including the processing chamber 100 shown in FIG. 1, according to one or more embodiments. A sensor device 500 is disposed above the plate 171 and the upper window 108. The sensor device 500 can be used in place of one or more of the sensor 195, 197, 198, 272 shown in FIG. 1.

The sensor device 500 includes an eyepiece 501 mounted to a sensor housing 502. The sensor device 500 includes a first optical sensor 506 configured to detect energy having a first wavelength, and a second optical sensor 505 configured to detect energy having a second wavelength that is more than the first wavelength. The optical sensors 505, 506 are disposed in the sensor housing 502. In one or more embodiments, the second wavelength is within a range of about 3.17 microns to about 3.67 microns, such as about 3.3 microns to about 3.5 microns. In one or more embodiments, the second wavelength is about 3.4 microns, such as 3.42 microns. In one or more embodiments, the first wavelength is within a range of about 2.48 microns to about 2.98 microns, such as about 2.6 microns to about 2.8 microns. In one or more embodiments, the first wavelength is about 2.7 microns, such as 2.73 microns.

The sensor device 500 includes a first light emitter 508 configured to emit a first beam 512 (e.g., light beam) toward a first area of the one or more calibration substrates 310 315. The sensor device 500 includes a second light emitter 507 configured to emit a second beam 511 (e.g., light beam) toward a second area of the one or more calibration substrates 310 315. The first area of the first beam 512 overlaps with the second area of the second beam 511 by at least 80% of the second area. The first area overlaps with the second area, for example, along the vertical direction from the substrate support 106 and toward the plate 171. The eyepiece 501 is configured to collect reflected portions of the beams 511, 512 and the optical sensors 505, 506 are configured to measure the intensities of the reflected portions of the beams 511, 512 that have the respective first wavelength and second wavelength.

The upper window 108 and the plate 171 include a quartz, such as transparent quarts. The quartz of the upper window 108 and the plate 171 can have a hydroxyl concentration that is, for example, less than 100 parts-per-million (ppm) (such as 30 ppm or less, such as within a range of about 5 ppm to about 30 ppm), or more than 750 parts-per-million (ppm), such as 900 ppm or more. Other values are contemplated for the hydroxyl concentration of the plate 171 and the upper window 108.

Using the quartz of the upper window 108, the plate 171, and the second calibration substrate 315 (described above) facilitates accurately and efficiently measuring temperatures of the plate 171 and the substrate support 106 (and/or the substrate 102) during processing, and facilitates accurately and efficiently calibrating one or more of the sensors 195, 197, 198, 272. As recited herein, the hydroxyl concentration refers to a parts-per-million (ppm) measurement of hydroxyl groups (e.g., groups including an oxygen atom covalently bonded to a hydrogen atom) in or on the respective quartz material. In one or more embodiments, the ppm measurement of the hydroxyl concentration is a measured concentration of hydroxyl groups relative to all other materials (such as contaminants and/or quartz) present on the respective quartz surfaces of the first quartz or the second quartz. In one or more embodiments, the measurement of the hydroxyl concentration is conducted by X-ray photoelectron spectroscopy (XPS) and provided in the unit of ppm. The present disclosure contemplates that other measurement techniques, such as glow discharge mass spectroscopy (GDMS), may be used to measure the ppm values of the hydroxyl concentration.

In one or more embodiments, at least a portion of the shaft 118 and/or the arms 119 include the same quartz (such as are formed of the same quartz) as the upper window 108 and/or the plate 171. In one or more embodiments, at least a portion of the shaft 135, the arms 139 and/or the lift pin stops 134 include the same quartz (such as are formed of the same quartz) as the upper window 108 and/or the plate 171.

The hydroxyl concentrations can be affected, for example, by the water content and/or contamination content in the respective quartz. The hydroxyl concentration of the second calibration substrate 315 involves a lower transmission of energy having the first wavelength. The hydroxyl concentration of the second calibration substrate 315 involves a higher transmission of energy having the second wavelength.

In one or more embodiments, the second calibration substrate 315 is transmissive for the second wavelength and is absorptive for the first wavelength. In one or more embodiments, the material of the substrate support 106 is absorptive for the second wavelength. Energy having the second wavelength can transmit through the upper window 108 and the plate 171 to reach the substrate 102 and/or the substrate support 106). For the second wavelength, the upper window 108 and/or the plate 171 have a relatively high transmission (e.g., 75% or higher, such as 80% or higher). Energy having the first wavelength can transmit through the upper window 108 and be absorbed and/or reflected by the plate 171. For the first wavelength, the upper window 108 has a relatively high transmission (e.g., 75% or higher, such as 80% or higher) and the plate 171 has a relatively low transmission (e.g., less than 80%, such as less than 50%, less than 20%, or less than 10%, for example 5% or less, such as about 0%).

In one or more embodiments, the quartz of the second calibration substrate 315 is transmissive for less than 5% (such as about 0%) of energy (e.g., light) having the first wavelength. The second calibration substrate 315 is synthetic quartz, such as quartz formed using a soot process.

The plate 171 can be fused quartz, such as electrically fused quartz, or synthetic quartz, such as quartz formed using a soot process.

The sensor device 500 is shown as a multi-wavelength (e.g., dual-wavelength) sensor device. The present disclosure contemplates that the first optical sensor 506 can be disposed in a first sensor housing of a first sensor device, the first light emitter 508 can be mounted to the first sensor housing, the second optical sensor 505 can be disposed in a second sensor housing of a second sensor device, and the second light emitter 507 can be mounted to the second sensor housing. A first eyepiece can be mounted to the first sensor housing, and a second eyepiece can be mounted to the second sensor housing. The first sensor housing and the second sensor housing are positioned in relation to each other such that the second optical beam 511 overlaps (as described above) with the first optical beam 512 by at least 80%.

Figure 5B:
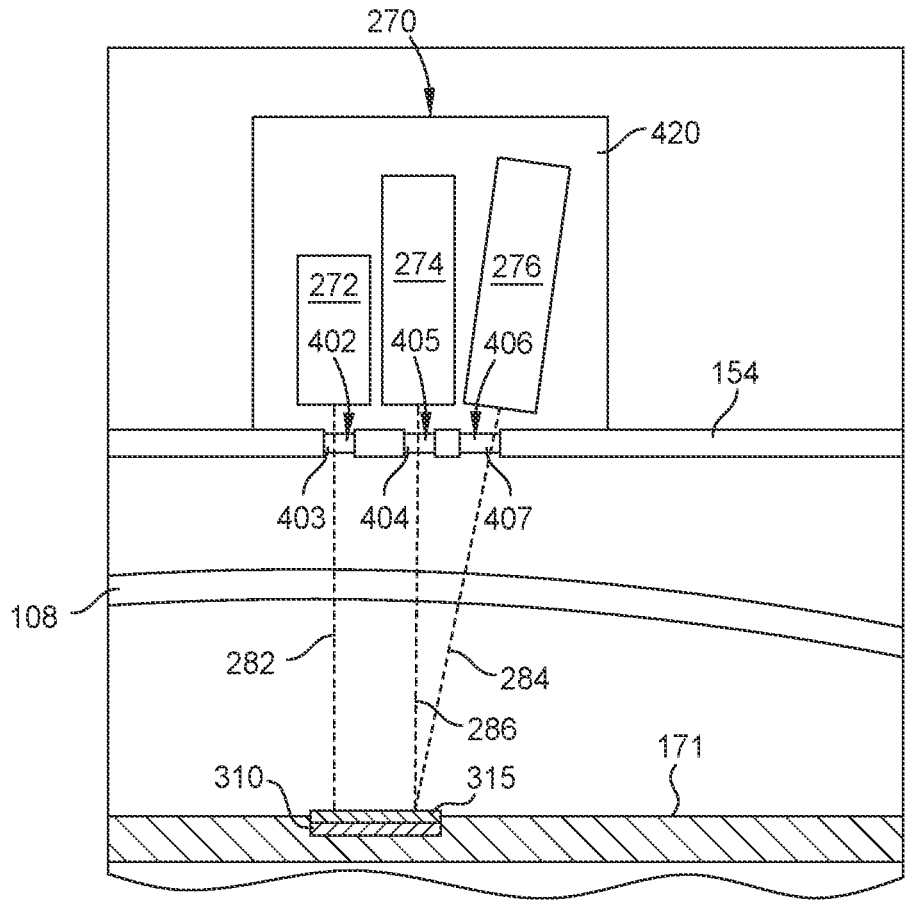
FIG. 5B is a schematic sectional view of the measurement assembly used with respect to the process chamber of FIG. 1, according to one or more embodiments.

FIG. 5B is a schematic sectional view of the measurement assembly 270 used with respect to the process chamber 100 of FIG. 1, according to one or more embodiments. In addition to the components described with regard to FIG. 1, the measurement assembly 270 of FIG. 4 includes a first window 403, a second window 404, a third window 407, and a cover 420.

The first window 403 is disposed within a first opening 402. The first window 403 is disposed between the upper temperature sensor 272 and the upper window 108. The first window 403 is disposed between the upper temperature sensor 272 and the one or more calibration substrates 310, 315. The first window 403 is a quartz window and allows for radiation from within the process chamber 100 to pass therethrough. The first window 403 may filter radiation to allow wavelengths which the upper temperature sensor 272 measures while filtering out other wavelengths. The radiation traveling along the first measurement radiation path 282 travels between a top side of the one or more calibration substrates 310, 315 and the upper temperature sensor 272. The first measurement radiation path 282 intersects both the upper window 108 and the first window 403. In one or more embodiments, the first measurement radiation path 282 may intersect the top side of the second calibration substrate 315 at any radial position along the second calibration substrate 315. In one or more embodiments, the first measurement radiation path 282 intersects the top side of the second calibration substrate 315 at a specific location, such as either less than 15 mm from the center of the second calibration substrate 315, such as less than 10 mm from the center of the second calibration substrate 315, such as less than 5 mm from the center of the second calibration substrate 315; or the first measurement radiation path 282 intersects the top side of the second calibration substrate 315 at a radius of about 110 mm to about 130 mm, such as about 115 mm to about 125 mm, such as about 120 mm.

The second window 404 is disposed within a second opening 405. The second window 404 is disposed between the energy source 274 and the upper window 108. Therefore, the second window 404 is disposed between the energy source 274 and the one or more calibration substrates 310, 315. The second window 404 allows energy (e.g., light) emitted by the energy source 274 to pass therethrough. The energy emitted by the energy source 274 and traveling along the first calibration beam 286 is disposed between the energy source 274 and the top side of the calibration substrate 260A. The first calibration beam 286 passes through both of the upper window 108 and the second window 404. The first calibration beam 286 may intersect the top side of the second calibration substrate 315 at any radial position along the second calibration substrate 315. In one or more embodiments, the first calibration beam 286 intersects the top side of the second calibration substrate 315 either less than 15 mm from the center of the calibration substrate, such as less than 10 mm from the center of the second calibration substrate 315, such as less than 5 mm from the center of the second calibration substrate 315 or the first calibration beam 286 intersects the top side of the second calibration substrate 315 at a radius of about 110 mm to about 130 mm, such as about 115 mm to about 125 mm, such as about 120 mm.

The first calibration beam 286 intersects the top side of the second calibration substrate 315 within less than 5 mm, such as less than 2 mm, such as less than 1 mm from the location in which the first measurement radiation path 282 intersects the radiation path. In one or more embodiments, the first calibration beam 286 intersects the top side of the second calibration substrate 315 at the same radial position as the first measurement radiation path 282. Measuring the second calibration substrate 315 at the same location allows for a direct comparison between temperature measurements and reduces error when compared to measurements made at different radial distances from the center of the second calibration substrate 315.

The third window 407 is disposed within a third opening 406 formed through the lid 154. The third window 407 is disposed between the band edge detector 276 and the upper window 108. The third window 407 is disposed between the band edge detector 276 and the one or more calibration substrates 310, 315.

The energy (e.g., light) received by the band edge detector 276 and traveling along the second calibration beam 284 is disposed between the band edge detector 276 and the top side of the second calibration substrate 315. The second calibration beam 284 passes through both of the upper window 108 and the third window 407. The second calibration beam 284 intersects the top side of the second calibration substrate 315 at the same location as the first calibration beam 286. The second calibration beam 284 is a reflection of the first calibration beam 286 off the top side of the second calibration substrate 315. The second calibration beam 284 is altered by intersecting the second calibration substrate 315 and has a reduced wavelength range that is measured by the band edge detector 276.

The cover 420 is disposed above the lid 154 and surrounds the upper temperature sensor 272, the energy source 274, and the band edge detector 276. The cover 420 may be disposed around each of the upper temperature sensor 272, the energy source 274, and the band edge detector 276 individually, such that there are a plurality of covers 420. The cover 420 may serve as a support to hold each of the upper temperature sensor 272, the energy source 274, and the band edge detector 276 in place. The cover 420 facilitates reducing or preventing radiant energy from escaping the process chamber 101 and interfering with other equipment. The temperature of a portion of the second calibration substrate 315 is measured using the upper temperature sensor 272.

Figure 5C:
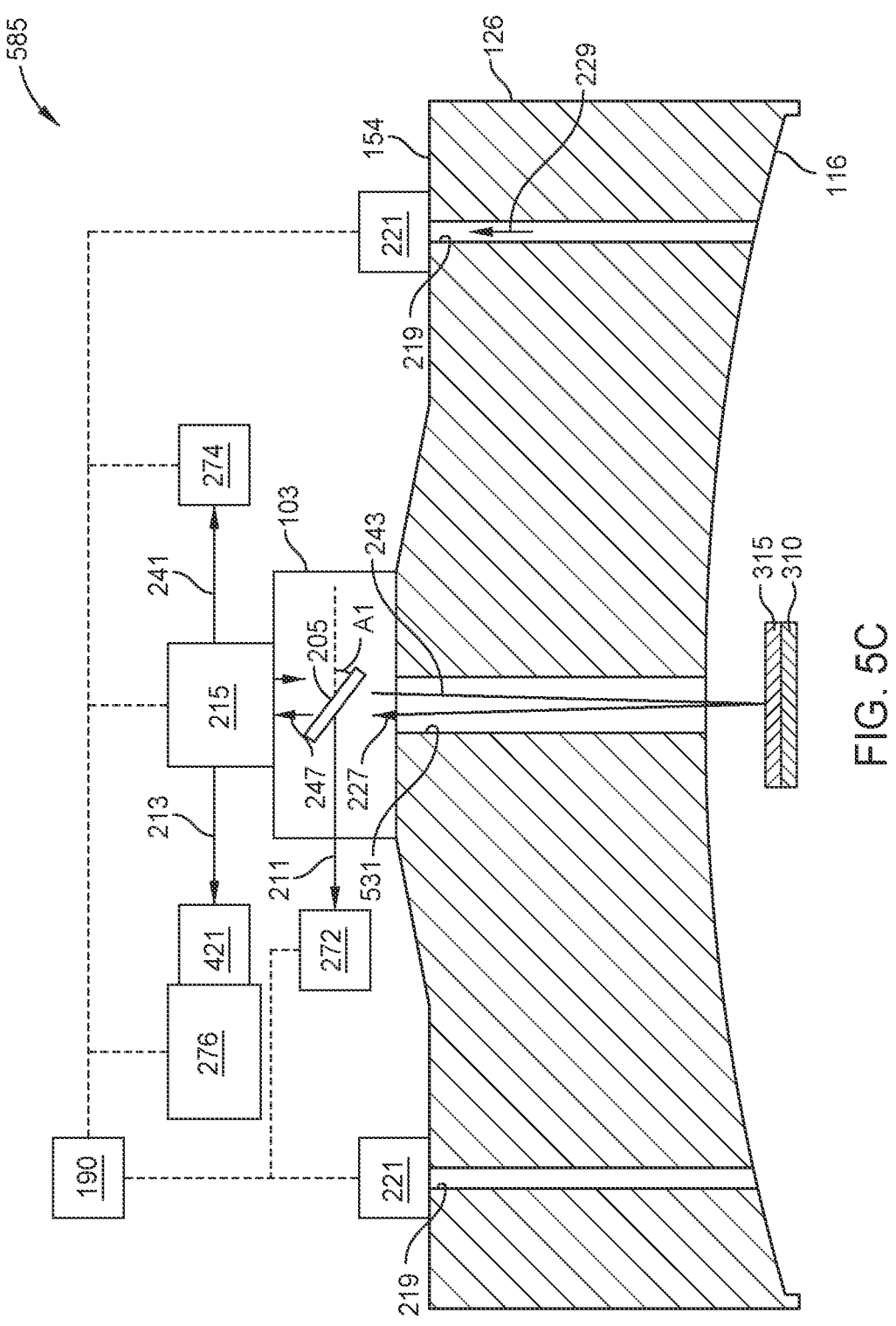
FIG. 5C is a partial schematic cross-sectional view of an in-situ reflectometry (ISR) system that can be used with the measurement assembly, according to one or more embodiments.

FIG. 5C is a partial schematic cross-sectional view of an in-situ reflectometry (ISR) system 585 that can be used with the measurement assembly 270, according to one or more embodiments. The present disclosure contemplates that other configurations may be used for the measurement assembly 270, for example other than reflectometers. For example, any other type of optical spectrometer(s) configured to detect (e.g., scan) a band edge range for a temperature range may be used. The ISR system 585 includes the energy source 274, a collimator 215, the band edge detector 276, the upper temperature sensor 272, one or more sensor assemblies 221 (two are shown), and a dichroic mirror 205 coupled to or disposed above the chamber lid 154. The ISR system 585 facilitates measurement of one or more properties of the substrate 102 (and/or a thin film disposed thereon). Example properties include temperature, thin film growth rate, thickness of a thin film, thin film optical properties and/or in-film Ge concentration.

The energy source 274 is configured to generate energy 241 (e.g., radiation, such as light). For example, the energy source 274 could be a flash lamp, capable of producing full spectrum or partial spectrum light. In one or more embodiments, the spectrum of light generated has a wavelength between about 200 nm to about 4 micrometers, such as 200 nm to about 800 nm and/or 3 micrometers to 4 micrometers. Full spectrum light allows for a wide range of light signals for analysis, however in one or more embodiments a light source may be limited to a specific wave length of light or specific range of light wave lengths to accomplish the analysis. The energy source 274 may be controlled by the controller 190. The energy source 274 is in optical communication with a collimator 215, and directs energy 241 to the collimator 215 upon instruction of the controller 190. Optical communication includes connected by a fiber optic cable, and other modes of light transmission are contemplated. The travel path of the energy from the energy source 274 may be referred to as a propagation path. The collimated energy 243 (e.g., radiation, such as light) leaves the collimator 215, and travels through a passage 531. In one or more embodiments, the passage 531 includes a light pipe. The passage 531 can be a made of any material capable of transmitting light of predetermined wavelengths, for example, sapphire. The passage 531 directs the collimated energy 243 to the surface of the substrate 102 (or a thin film thereon) or surface(s) of the one or more calibration substrates 310, 315 to facilitate measurement of one or more properties of the substrate 102 (or a thin film thereon) or the plate 171, or one or more properties (such as the transition wavelength) of the one or more calibration substrates 310, 315.

The collimated energy 243 is reflected off the target measurement surface, such as the second calibration substrate 315, and is reflected back as reflected energy 227. The reflected energy 227 travels back through the passage 531. The reflected energy 227 leaves the passage 531 and travels to the dichroic mirror 205 aligned with the passage 531 along the travel path of the reflected energy 227. In one or more embodiments, the dichroic mirror 205 is a transparent material with a dielectric coating. The dielectric coating may include, but is not limited to, magnesium fluoride, tantalum pentoxide, and/or titanium dioxide. The dichroic mirror 205 reflects certain wavelengths of energy (e.g., light) away to the upper temperature sensor 272, but allows other specifically selected wavelengths to pass through to the collimator 215. A wavelength range directed to the band edge detector 276 through the collimator 215 may be between about, 100 nm and about 1000 nm, such as within a range of 200 nm and 800 nm, such as within a range of 200 nm and 400 nm, and such as within a range of 400 nm and 800 nm. Other wavelengths are contemplated. The dichroic mirror 205 facilitates multiple light based sensors to be utilized by directing light of a first desired range of to one sensor (such as the band edge detector 276) with the remaining light wavelengths being sent to at least another sensor (such as the upper temperature sensor 272). Thus, use of optical spectrometer(s) and/or the ISR system 585 facilitates a compact measurement system, allowing more sensors to be included in a smaller footprint. The dichroic mirror 205 is arranged, or oriented, at an angle of incidence A1 between about, 30° and about 60°, such as within a range of 35° and 55°, with a plane near orthogonal to a longitudinal axis of the passage 531. Other angles of incidence are contemplated.

As shown in FIG. 5C, light reflected from the dichroic mirror 205 is transmitted to the upper temperature sensor 272 along an energy path 211 (e.g., a light path). In one or more embodiments, light having the first wavelength travel along the energy path 211 to the upper temperature sensor 272. As noted above, properties of the dichroic mirror 205 are selected to transmit or reflect light in specified wavelength ranges. Energy 247 (e.g., light) allowed to pass through the dichroic mirror 205 is collimated by the collimator 215. The collimated energy 213 is directed to the band edge detector 276. In one or more embodiments, the band edge detector 276 includes an optical spectrometer, a spectrograph configured to measure wavelength-resolved intensity. The band edge detector 276 can include a grating, an optical lens, a filter 421 and/or a linear-array photodiode detector. The filter 421 can be a short pass filter to limit the noise from a heat source (such as the heat sources 143), or a dielectric filter. A dielectric filter includes any thin film based filters than can reduce or prevent specific wavelength of light from passing therethrough. While the filter 421 is described as part of the band edge detector 276, it is contemplated that the filter can be located in other locations. For example, the filter 421 can be part of the dichroic mirror 205. The filter 421 is configured to allow light of a specified wavelength to pass therethrough, while reducing or preventing passing or other wavelengths. In one or more embodiments, the filter 421 allows light of wavelengths below 700 nm to pass therethrough (while filtering out light of wavelengths above 700 nm) to mitigate light signal noise from heat sources of the process chamber, thus improving measurement accuracy. It is contemplated that the filter 421 can be placed in any light path that includes the light reflected off the substrate 102 (e.g., reflected energy 227 to the band edge detector 276, reflected energy 247 from dichroic mirror 205, and/or collimated energy 243). In one or more embodiments, the filter 421 is an integral component of band edge detector 276. In one or more embodiments, the filter 421 is a standalone component from the band edge detector 276. In one or more embodiments, the filter 421 is not included in the path. It is to be noted that while embodiments described herein may include a filter 421 and/or a dichroic mirror 205, both the filter 421 and the mirror 205 are optional and may be excluded from any embodiment or implementation described herein.

In one or more embodiments, the band edge detector 276 is configured to read a reference material of the first calibration substrate 310 for use as a temperature reference. For example, the reference material can have known properties. For the sensor assembly, the reflected signal travels back to the dichroic mirror and is split into multiple paths (e.g., propagation sub-paths). A first propagation sub-path directs reflected light to the respective temperature sensor 272, while a second propagation sub-path directs reflected light to the collimator 215 and then to the band edge detector 276. The light intensity collected by the band edge detector 276 is analyzed for true reflectance, which is compared with models, for example using nonlinear fitting equations (e.g., Fresnel equations) or other empirically derived equations to determine an adjusted temperature reading for the temperature sensor 272.

In one or more embodiments, models are empirically derived by obtaining absorption/reflectance data for light at predetermined wavelengths for the second calibration substrate 315. The data may be collected at conditions which approximate those of a predetermined recipe for processing future substrates, such as a process recipe at which the model will be utilized. The data is then fit to an equation, such as a non-linear equation. Light received by the band edge detector 276 is analyzed for intensity (e.g., true reflectance of light reflected from the measured calibration substrate) and fit to the empirically derived equation to determine the adjusted temperature reading. Stated otherwise, the amount of light reflected from the second calibration substrate 315 surface changes depending upon the band edge wavelength, and the amount of light can be compared to known data to determine the adjusted temperature reading. This data and/or equations may also take into account other optical properties, such as refractive index and/or extinction coefficient, to facilitate measurement accuracy.

The present disclosure contemplates that a plurality of band edge wavelength measurements for the second calibration substrate 315 can be averaged for an adjusted temperature (e.g., a correction value) to be applied to temperature measurements taken using a temperature sensor (such as upper temperature sensor 272).

Figure 6:
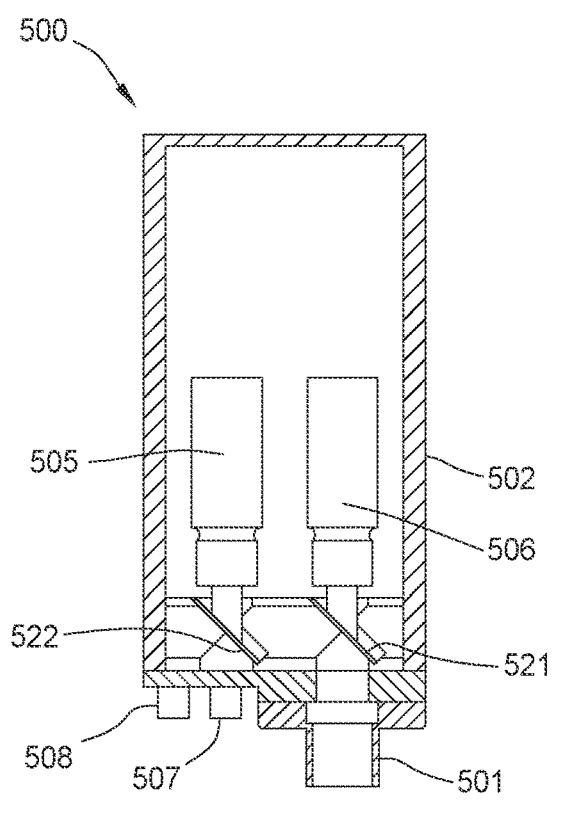
FIG. 6 is a schematic enlarged cross-sectional view of the sensor device shown in FIG. 5A, according to one or more embodiments.

FIG. 6 is a schematic enlarged cross-sectional view of the sensor device 500 shown in FIG. 5A, according to one or more embodiments.

The sensor device 500 includes a beam splitter 521 (such as a mirror) configured to transmit the energy (e.g., the reflected portion of the first beam 512) having the first wavelength therethrough and toward the first optical sensor 506, and reflect the energy (e.g., the reflected portion of the second beam 511) having the second wavelength. In one or more embodiments, a mirror 522 (such as a second beam splitter) is configured to reflect the energy (e.g., the reflected portion of the second beam 511) having the second wavelength toward the second optical sensor 505. In one or more embodiments, the mirror 522 reflects about 95% or more of energy incident on the mirror 522.

Figure 7:
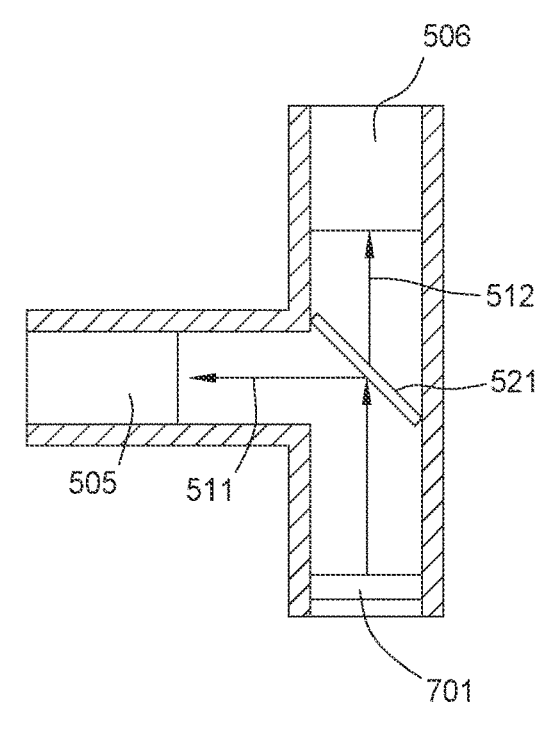
FIG. 7 is a schematic plan view of the optical paths in the sensor device of the respective reflected portions of the first beam and the second beam shown in FIG. 5A, according to one or more embodiments.

FIG. 7 is a schematic plan view of the optical paths in the sensor device 500 of the respective reflected portions of the first beam 512 and the second beam 511 shown in FIG. 5A, according to one or more embodiments.

After being collected through the eye piece 501, the reflected portions of the first beam 512 and the second beam 511 travel to the beam splitter 521. The reflected portion of the second beam 511 having the second wavelength reflects off of the beam splitter 521 along a path toward the second optical sensor 505. The reflected portion of the first beam 512 having the first wavelength transmits through the beam splitter 521 along a path toward the first optical sensor 506.

Figure 8:
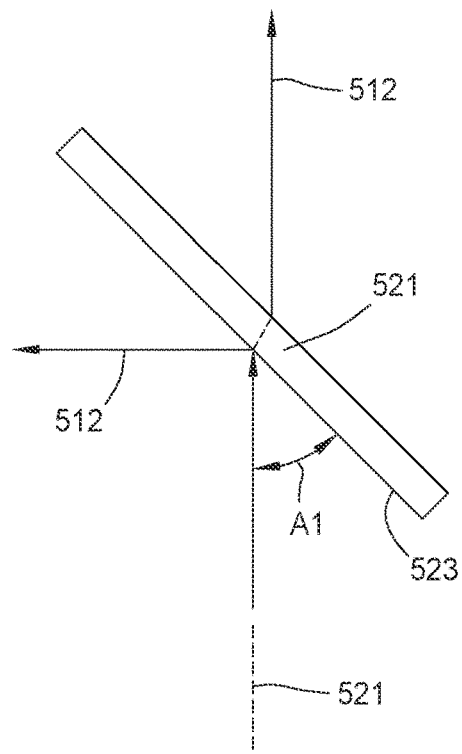
FIG. 8 is a schematic side view of the beam splitter shown in FIGS. 6 and 7, according to one or more embodiments.

FIG. 8 is a schematic side view of the beam splitter 521 shown in FIGS. 6 and 7, according to one or more embodiments.

The beam splitter 521 is oriented such that a surface 523 facing the incoming reflected energy is at an angle A1 relative to a longitudinal axis of the eyepiece 501. In one or more embodiments, the angle A1 is within a range of about 40 degrees to about 50 degrees. In one or more embodiments, the angle A1 is about 45 degrees.

Figure 9:
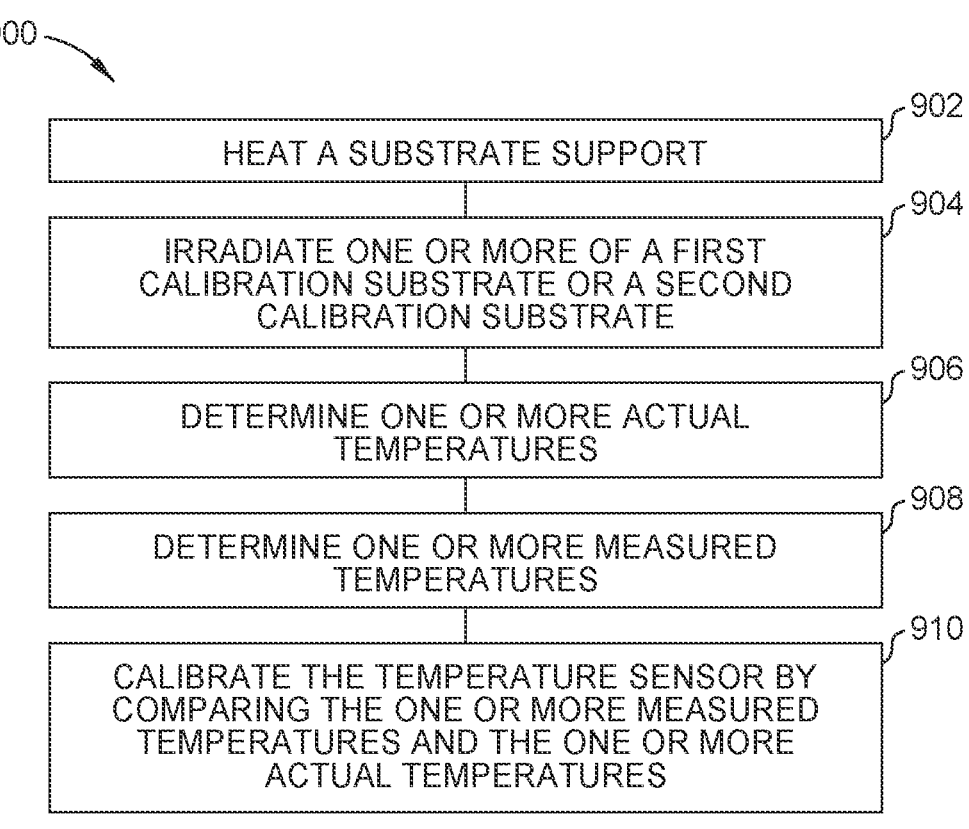
FIG. 9 is a schematic flow diagram view of a method of calibrating a temperature sensor applicable for semiconductor manufacturing, according to one or more embodiments.

FIG. 9 is a schematic flow diagram view of a method 900 of calibrating a temperature sensor applicable for semiconductor manufacturing, according to one or more embodiments.

Operation 902 includes heating a substrate support positioned in a process chamber. In one or more embodiments, the substrate support is heated from below (e.g., using the heat sources 143 shown in FIG. 1). In one or more embodiments, the substrate support is heated using one or more heat sources (such as the heat sources 143) positioned outwardly of a first window (such as the lower window 110) on a first side of the substrate support, and the temperature sensor is positioned outwardly of the plate and a second window (such as the upper window 108) on a second side of the substrate support.

Operation 904 includes irradiating, using an energy source, one or more of a first calibration substrate or a second calibration substrate positioned at least partially in an opening formed in a plate positioned in the process chamber.

Operation 906 includes determining one or more actual temperatures using energy reflected off of one of the first calibration substrate or the second calibration substrate. In one or more embodiments, the second calibration substrate is supported on the first calibration substrate (as shown in FIG. 3), and the energy is reflected off of the second calibration substrate and is received by a band edge detector (such as the band edge detector 276). In one or more embodiments, the first calibration substrate is supported on the second calibration substrate (as shown in FIG. 4), and the energy is reflected off of the first calibration substrate and is received by a second temperature sensor (such as the second optical sensor 505 shown in FIG. 5A).

Operation 908 includes determining one or more measured temperatures using energy reflected off of the other of the first calibration substrate or the second calibration substrate and received by the temperature sensor (such as the first optical sensor 506 shown in FIG. 5A).

Operation 910 includes calibrating the temperature sensor by comparing the one or more measured temperatures and the one or more actual temperatures. In one or more embodiments, the calibrating of the temperature sensor includes establishing one or more correction ratios correlated to the one or more measured temperatures by dividing the respective one or more actual temperatures by the corresponding one or more measured temperatures. The corresponding one or more measured temperatures are the measured temperatures that are measured at substantially the same time (such as within a difference of 0.1 seconds or less) as the one or more actual temperatures. In one or more embodiments, the calibrating of the temperature sensor includes correlating respectively the one or more actual temperatures to the one or more measured temperatures, and storing the one or more measured temperatures and the correlated one or more actual temperatures in a memory such that a temperature measurement (e.g., during subsequent temperature measuring using the temperature sensor after calibration) indicating one of the one or more measured temperatures is adjusted to return a reading indicating the corresponding one of the one or more actual temperatures.

The information of the method 900 (such as the one or more actual temperatures, the one or more measured temperatures, and/or the one or more correction ratios) can be stored and tracked as data. In one or more embodiments, the data is analyzed and/or compared using averages, derivatives, modeling, imaging, and/or with other data analysis techniques. As an example, the optical sensors 505, 506 can capture images, and the intensity of the images can be analyzed for detection of the actual temperatures and actual temperatures.

Figure 10:
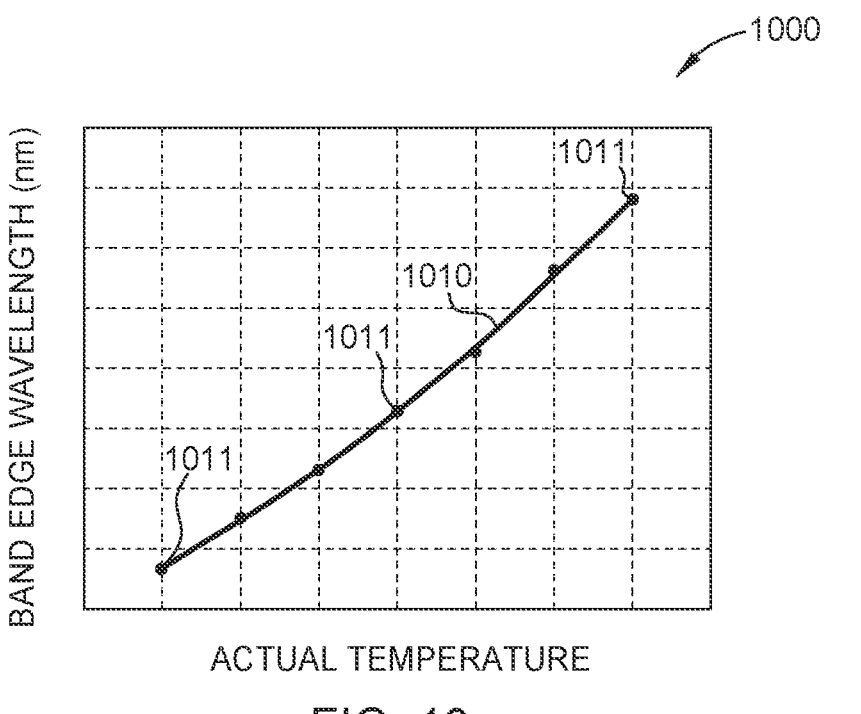
FIG. 10 is a schematic graphical view of a graph including a band edge reference profile 1010, according to one or more embodiments.

FIG. 10 is a schematic graphical view of a graph 1000 including a band edge reference profile 1010, according to one or more embodiments. The band edge reference profile 1010 shows, for a material (such as the material of the second calibration substrate 315) a plurality of band edge wavelengths across a plurality of actual temperatures. The band edge reference profile 1010 can be stored in the memory in relation to the method 900, and can be referenced to use a detected band edge wavelength to indicate an actual temperature in relation to operation 906. For example, a measured band edge wavelength (detected using the band edge detector 276) can be correlated to an actual temperature along the band edge reference profile 1010 in order to determine the actual temperature. The band edge reference profile 1010 can be formed by measuring actual temperatures for corresponding band edge wavelengths at a plurality of data points 1011, and then line fitting (such as curve fitting) the data points 1011.

Figure 11:
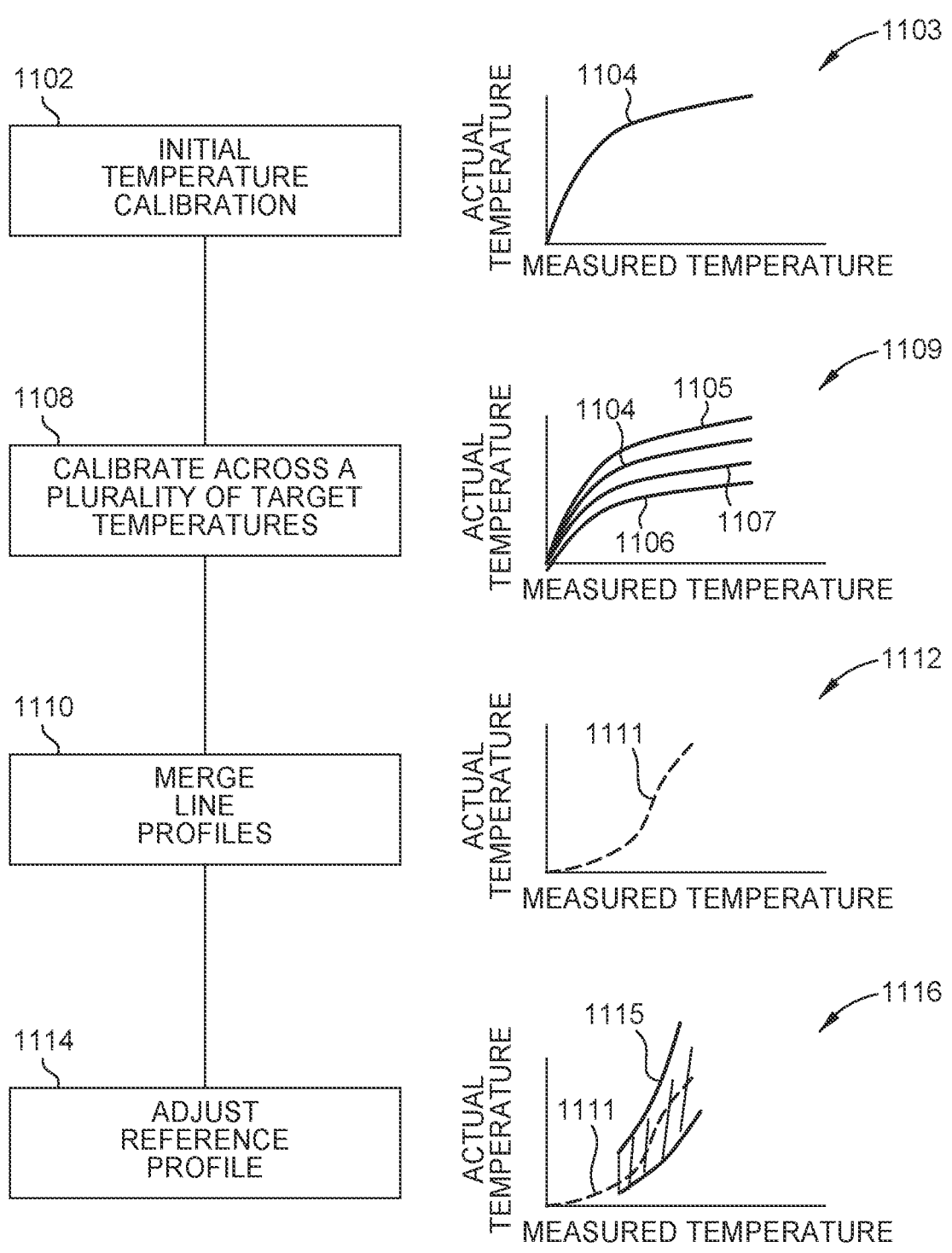
FIG. 11 is a schematic flow diagram view of an exemplary implementation of the method shown in FIG. 9, according to one or more embodiments.

FIG. 11 is a schematic flow diagram view of an exemplary implementation of the method 900 shown in FIG. 9, according to one or more embodiments.

Operation 1102 includes an initial temperature calibration for the temperature sensor, and graph 1103 shows a line profile 1104 of actual temperatures versus measured temperatures using data collected during the initial temperature calibration. During the initial temperature calibration, the method 900 is conducted.

Operation 1108 includes calibrating by conducting the method 900 one or more additional times to generate additional line profiles 1105-1107 across a plurality of target temperatures shown in graph 1109. In one or more embodiments, operation 1108 includes heating the substrate support across the plurality of target temperatures, and each profile 1104-1107 corresponds to one of the plurality of target temperatures. The target temperatures can be achieved by a plurality of different bias power levels applied to the lower heat sources 143. The one or more measured temperatures and the correlated one or more actual temperatures can be stored (e.g., in a library in the memory) as the plurality of line profiles 1104-1107. The line profiles 1104-1107 can be generated at different times (such as on different days) and can include sensor drift and/or heater drift.

Operation 1110 includes merging the plurality of line profiles 1104-1107 (which can be stored in the library in the memory) are merged to create a reference profile 1111 shown in graph 1112. The reference profile 1111 can be used to calibrate (e.g., correct) temperature measurements taken by the temperature sensor. The merging can include averaging values along the profiles 1104-1107 (which can be line-fitted), and the averaging can include weighted averaging.

Operation 1114 adjusting the reference profile 1111 using adjustment fields 1115, as shown in graph 1116. The adjustment fields 1115 can be calculated and applied using a model, such as a model that includes one or more machine learning and/or artificial intelligence algorithms. The model can use other measurements, such as film thickness measurements conducted on processed substrates and/or substrates being processed to determine film uniformities and/or film deposition rates.

Benefits of the present disclosure include accurate adjustment and calibration of temperature measurements (such as calibration of the temperature sensor that measures temperatures of the plate 171); simple and quick calibration of temperature sensors); temperature measurements that account for aging and wear of chamber components; adjustability of parameters (such as temperatures, deposition uniformities, and/or deposition rates (e.g., in nm per minute)) across a variety of operation conditions (such as low rotation speeds, high pressures, and/or low flow rates);

broader and/or more modular ranges of adjustability; and increased deposition uniformity and/or deposition rates.

Benefits of the present disclosure also include accounting for radiation interference in temperature calibration, and accounting for component drift (such as aging) in temperature calibration. For example, using subject matter described herein, calibration of the plate 171 sensor (such as the upper sensor 272) can account for radiation received from the substrate 102 and radiation received from a heat source (such as the heat sources 143). As another example, the subject matter described herein facilitate accurate readings for the plate 171 temperature, the substrate 102 temperature, and/or heat intensity of heat sources (such as the lower heat sources 143).

Benefits of the present disclosure also include increased component lifespan; reduced chamber downtime; and increased throughput. Benefits of the present disclosure also include enhanced deposition repeatability and/or cleaning repeatability.

It is contemplated that one or more aspects disclosed herein may be combined. As an example, one or more aspects, features, components, operations and/or properties of the processing chamber 100, the controller 190, the one or more sensors 195, 197, 198, 272, the plate 171, the measurement assembly 270, the band edge detector 276, the first calibration substrate 310, the second calibration substrate 315, the sensor device 500, the ISR system 585, the method 900, the graph 1000, and/or the exemplary implementation shown in FIG. 11 may be combined. For example, the operations and/or parameters described in relation to FIGS. 1, 3, 4, and/or 11 can be combined with the operations and/or the parameters of the method 900. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A chamber kit for processing chambers applicable for semiconductor manufacturing, comprising:
    a plate formed of a transparent material, the plate comprising an opening formed in an outer face of the plate;
    a first calibration substrate positioned at least partially in the opening of the plate, the first calibration substrate formed of a first material; and
    a second calibration substrate positioned at least partially in the opening of the plate, the second calibration substrate formed of a second material that is different than the first material, wherein one of the first calibration substrate or the second calibration substrate is supported by a recessed surface of the plate, and the other of the first calibration substrate or the second calibration substrate is supported by the one of the first calibration substrate or the second calibration substrate.

2. The chamber kit of claim 1, wherein the plate comprises a thickness that is 5.0 mm or less.

3. The chamber kit of claim 1, wherein:
    the first material comprises one or more of: doped silicon, InP, GeN, or silicon carbide (SiC); and
    the second material comprises a quartz material.

4. The chamber kit of claim 3, wherein the first material is SiC having an atomic structure that is 4H.

5. The chamber kit of claim 4, wherein the quartz material of the second material has a hydroxyl concentration that is more than 750 ppm.

6. The chamber kit of claim 3, wherein the first calibration substrate is supported by the recessed surface of the plate, and the second calibration substrate is supported by the first calibration substrate.

7. The chamber kit of claim 6, further comprising:
    a band edge calibration assembly comprising:
        an energy source positioned to emit a first energy, and
        a band edge detector configured to receive the first energy; and
    a temperature sensor configured to receive a second energy.

8. The chamber kit of claim 7, further comprising a controller configured to:
    emit the first energy toward the first calibration substrate,
    determine a band edge absorption wavelength from the first energy reflected off of the first calibration substrate and received by the band edge detector,
    determine an actual temperature using the determined band edge absorption wavelength,
    determine a measured temperature based on the received second energy of the temperature sensor, and
    calibrate the temperature sensor by comparing the measured temperature and the actual temperature.

9. The chamber kit of claim 8, wherein the temperature sensor is a pyrometer configured to measure a wavelength within a range of 2.48 microns to 2.98 microns, the first energy is light, and the second energy is radiation.

10. The chamber kit of claim 3, wherein the second calibration substrate is supported by the recessed surface of the plate, and the first calibration substrate is supported by the second calibration substrate.

11. The chamber kit of claim 10, further comprising:
    a first temperature sensor configured to receive a first energy; and
    a second temperature sensor configured to receive a second energy.

12. The chamber kit of claim 11, further comprising a controller configured to:
    emit the first energy and the second energy toward the first calibration substrate,
    determine an actual temperature using the second energy reflected off of the first calibration substrate and received by the second temperature sensor,
    determine a measured temperature based on the received first energy of the first temperature sensor
    calibrate the first temperature sensor by comparing the measured temperature and the actual temperature.

13. The chamber kit of claim 12, wherein the first temperature sensor is a pyrometer configured to measure a first wavelength within a range of 2.48 microns to 2.98 microns, the second temperature sensor is a pyrometer configured to measure a second wavelength within a range of 3.17 microns to 3.67 microns, the first energy is radiation, and the second energy is radiation.

14. A method of calibrating a temperature sensor applicable for semiconductor manufacturing, the method comprising:
    heating a substrate support positioned in an internal volume of a process chamber;
    irradiating, using an energy source, one or more of a first calibration substrate or a second calibration substrate positioned at least partially in an opening formed in a plate positioned in the process chamber, the plate positioned in the internal volume between the substrate support and a window that at least partially defines the internal volume;

determining one or more actual temperatures using energy reflected off of one of the first calibration substrate or the second calibration substrate;

determining one or more measured temperatures using energy reflected off of the other of the first calibration substrate or the second calibration substrate and received by the temperature sensor; and calibrating the temperature sensor by comparing the one or more measured temperatures and the one or more actual temperatures.

15. The method of claim 14, wherein the substrate support is heated using one or more heat sources positioned outwardly of a first the window on a first side of the substrate support, and the temperature sensor is positioned outwardly of the plate and a second window on a second side of the substrate support.

16. The method of claim 14, wherein the calibrating of the temperature sensor comprises establishing one or more correction ratios correlated to the one or more measured temperatures by dividing the respective one or more actual temperatures by the corresponding one or more measured temperatures.

17. The method of claim 14, wherein the calibrating of the temperature sensor comprises:

correlating respectively the one or more actual temperatures to the one or more measured temperatures; and storing the one or more measured temperatures and the correlated one or more actual temperatures in a memory such that a temperature measurement indicating one of the one or more measured temperatures is adjusted to return a reading indicating the corresponding one of the one or more actual temperatures.

18. The method of claim 17, wherein the substrate support is heated across a plurality of target temperatures, and the one or more measured temperatures and the correlated one or more actual temperatures are stored as a plurality of line profiles, each line profile corresponding to one of the plurality of target temperatures.

19. The method of claim 18, wherein the plurality of line profiles are merged to create a reference profile.

20. A system for processing substrates and applicable for semiconductor manufacturing, the system comprising:

a chamber body comprising one or more sidewalls;

a window, the one or more sidewalls and the window at least partially defining an internal volume;

one or more heat sources configured to heat the internal volume;

a substrate support positioned in the internal volume;

a plate positioned in the internal volume between the substrate support and the window, the plate comprising an opening formed in an outer face of the plate;

a temperature sensor configured to sense temperatures of the plate;

a first calibration substrate positioned at least partially in the opening of the plate;

a second calibration substrate positioned at least partially in the opening of the plate;

a controller comprising instructions that, when executed, cause a plurality of operations to be conducted, the plurality of operations comprising:

heating the substrate support, irradiating, using an energy source, one or more of the first calibration substrate or the second calibration substrate;

determining one or more actual temperatures using energy reflected off of one of the first calibration substrate or the second calibration substrate; and determining one or more measured temperatures using energy reflected off of the other of the first calibration substrate or the second calibration substrate and received by the temperature sensor.

* * * * *